(12) United States Patent
Samata

(10) Patent No.: US 11,705,874 B2
(45) Date of Patent: Jul. 18, 2023

(54) POWER AMPLIFIER CIRCUIT

(71) Applicant: Murata Manufacturing Co., Ltd., Kyoto (JP)

(72) Inventor: Mitsunori Samata, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 379 days.

(21) Appl. No.: 17/130,680

(22) Filed: Dec. 22, 2020

(65) Prior Publication Data

US 2021/0203285 A1 Jul. 1, 2021

(30) Foreign Application Priority Data

Dec. 26, 2019 (JP) ................. 2019-237173
Mar. 19, 2020 (JP) ................. 2020-049743

(51) Int. Cl.
 *H03F 3/21* (2006.01)

(52) U.S. Cl.
 CPC ........ *H03F 3/211* (2013.01); *H03F 2200/222* (2013.01); *H03F 2200/387* (2013.01); *H03F 2200/451* (2013.01)

(58) Field of Classification Search
 CPC ............. H03F 3/211; H03F 2200/222; H03F 2200/387; H03F 2200/451
 USPC ....................................................... 330/296
 See application file for complete search history.

(56) References Cited

U.S. PATENT DOCUMENTS

| 10,469,032 B2 | 11/2019 | Namie | |
| 2005/0212604 A1* | 9/2005 | Cyr | H01L 24/49 331/16 |
| 2012/0235750 A1* | 9/2012 | Granger-Jones | H03F 1/302 330/296 |
| 2014/0253243 A1 | 9/2014 | Hagisawa et al. | |
| 2019/0199308 A1* | 6/2019 | Jingu | H03F 3/211 |
| 2020/0119695 A1 | 4/2020 | Shimamoto et al. | |

FOREIGN PATENT DOCUMENTS

JP 2014171170 A 9/2014

OTHER PUBLICATIONS

Li Chengzhan et al., "An on-chip temperature compensation circuit for an InGaP/GaAs HBT RF power amplifier", Journal of Semiconductors, vol. 32, No. 3, Mar. 2011 (Year: 2011).*

* cited by examiner

*Primary Examiner* — Hafizur Rahman
(74) *Attorney, Agent, or Firm* — Pearne & Gordon LLP

(57) ABSTRACT

A power amplifier circuit includes a first transistor having a first terminal to which a voltage corresponding to a variable power supply voltage is to be supplied and a second terminal to which a radio-frequency signal is to be supplied, the first transistor being configured to amplify the radio-frequency signal, a bias circuit configured to supply a bias current or voltage to the second terminal of the first transistor, and an adjustment circuit configured to adjust the bias current or voltage in accordance with the variable power supply voltage supplied from a power supply terminal.

20 Claims, 23 Drawing Sheets

POWER AMPLIFIER CIRCUIT

CROSS REFERENCE TO RELATED APPLICATIONS

This application claims priority from Japanese Patent Application No. 2019-237173 filed on Dec. 26, 2019, and claims priority from Japanese Patent Application No. 2020-049743 filed on Mar. 19, 2020. The contents of these applications are incorporated herein by reference in their entireties.

BACKGROUND OF THE DISCLOSURE

Field of the Disclosure

The present disclosure relates to a power amplifier circuit.

Description of the Related Art

Mobile communication terminals such as mobile phones include a power amplifier circuit for amplifying a radio-frequency (RF) signal to be transmitted to a base station. The power amplifier circuit includes a transistor for amplifying an RF signal, and a bias circuit for controlling a bias point of the transistor. One known bias circuit of this type is, for example, a bias circuit described in Japanese Unexamined Patent Application Publication No. 2014-171170, which includes an emitter follower transistor that supplies a bias signal to the transistor, and a constant voltage generation circuit for generating a constant voltage to be supplied to the collector of the emitter follower transistor.

An envelope tracking (ET) method has been attracted attention in recent years for controlling a power supply voltage in accordance with the envelope of a transmission signal to efficiently operate a transistor. In the ET method, linearity is maintained by a gain difference (gain dispersion) relative to a change in power supply voltage to be supplied to the transistor. However, the bias circuit described in Japanese Unexamined Patent Application Publication No. 2014-171170 may fail to provide a gain dispersion characteristic that meets the client's requirements for the characteristic.

BRIEF SUMMARY OF THE DISCLOSURE

Accordingly, it is an object of the present disclosure to provide a power amplifier circuit with an improved gain dispersion characteristic.

According to preferred embodiments of the present disclosure, a power amplifier circuit includes a first transistor having a first terminal to which a voltage corresponding to a variable power supply voltage is to be supplied, and a second terminal to which a radio-frequency signal is to be supplied, the first transistor being configured to amplify the radio-frequency signal; a bias circuit configured to supply a bias current or a bias voltage to the second terminal of the first transistor; and an adjustment circuit configured to adjust the bias current in accordance with the variable power supply voltage supplied from a power supply terminal. The bias circuit includes a first diode having an anode to which a bias control voltage or current is to be supplied, and a cathode; a second diode having an anode connected to the cathode of the first diode, and a cathode connected to ground; and a bias transistor having a first terminal to which a power supply voltage is to be supplied, a second terminal connected to the anode of the first diode, and a third terminal connected to the second terminal of the first transistor. The adjustment circuit includes a first resistor, and an adjustment transistor having a first terminal connected to the power supply terminal via the first resistor, a second terminal connected to the anode of the first diode, and a third terminal connected to the anode of the second diode.

According to preferred embodiments of the present disclosure, it may be possible to provide a power amplifier circuit with an improved gain dispersion characteristic.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

The following describes an embodiment of the present disclosure with reference to the drawings. As used herein, circuit elements given the same numerals represent the same or substantially the same circuit elements and will not be described repeatedly.

Configuration of Power Amplifier Module 1

Figure 1:
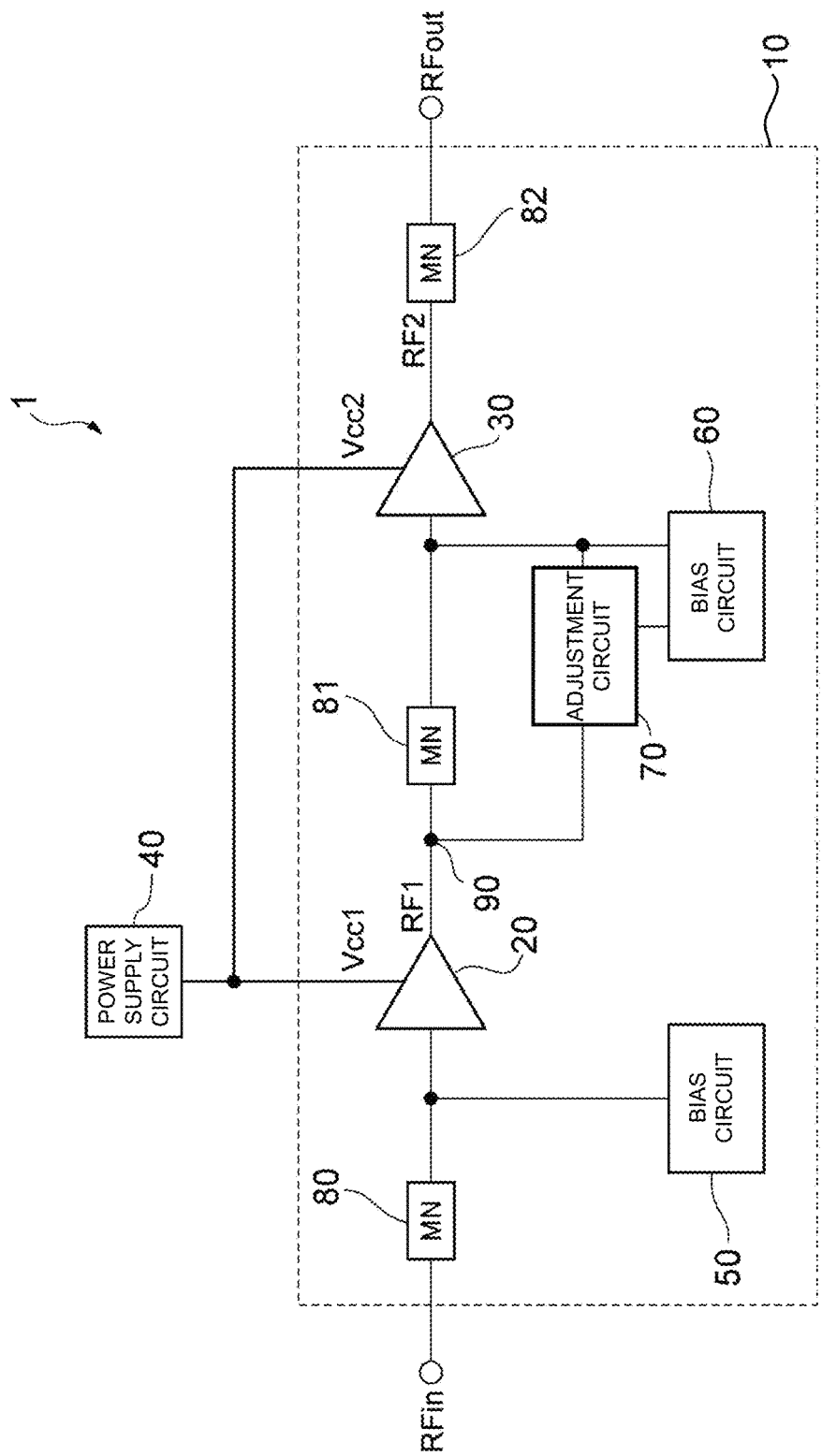
FIG. 1 illustrates a schematic configuration of a power amplifier module including a power amplifier circuit according to an embodiment.

FIG. 1 illustrates a schematic configuration of a power amplifier module 1 including a power amplifier circuit 10 according to this embodiment. The power amplifier module 1 may be mounted in, for example, a mobile communication device such as a mobile phone and is configured to amplify the power of an input signal RFin to a level required for transmission to a base station and output an amplified signal RFout. The input signal RFin is a radio-frequency (RF) signal modulated by, for example, a radio frequency integrated circuit (RFIC) or the like in accordance with a predetermined communication method. The input signal RFin complies with a communication standard, examples of which include the second-generation mobile communication system (2G), the third-generation mobile communication system (3G), the fourth-generation mobile communication system (4G), the fifth-generation mobile communication system (5G), Long-Term Evolution Frequency-Division Duplex (LTE-FDD), LTE Time-Division Duplex (LTE-TDD), LTE-Advanced, and LTE-Advanced Pro. The input signal RFin has a frequency in the range of, for example, about several hundreds of megahertz (MHz) to several tens of gigahertz (GHz). The communication standard and the frequency of the input signal RFin are not limited to those described above.

The power amplifier module 1 includes, for example, the power amplifier circuit 10 and a power supply circuit 40.

The power amplifier circuit 10 includes amplifiers 20 and 30, bias circuits 50 and 60, an adjustment circuit 70, and matching networks (MNs) 80 to 82.

Each of the amplifiers 20 and 30 amplifies an input RF signal and outputs an amplified RF signal. The amplifier 20 in the initial stage (driver stage) amplifies the input signal RFin inputted from an input terminal via the matching network 80 and outputs an RF signal RF1. The amplifier 30 in the subsequent stage (power stage) amplifies the RF signal RF1 supplied from the amplifier 20 via the matching network 81 and outputs an RF signal RF2. The RF signal RF2 is outputted via the matching network 82 as the amplified signal RFout. The amplifiers 20 and 30 are each constituted by, for example, a transistor such as a heterojunction bipolar transistor (HBT). Each of the amplifiers 20 and 30 may be constituted by a field-effect transistor (metal-oxide-semiconductor field-effect transistor (MOSFET)) instead of an HBT. In this case, the collector, the base, and the emitter are read as "drain", "gate", and "source", respectively. In the following description, each transistor is constituted by an HBT, unless otherwise noted.

The bias circuits 50 and 60 supply a bias current or bias voltage to the amplifiers 20 and 30, respectively.

A variable power supply voltage Vcc1 is supplied to the adjustment circuit 70, and the adjustment circuit 70 adjusts the bias current or bias voltage to be supplied to the amplifier 30 in accordance with the variable power supply voltage Vcc1.

The configuration of the amplifier 30, the bias circuit 60, and the adjustment circuit 70 will be described in detail below.

The matching network 80 matches the impedance between the preceding circuit (not illustrated) and the amplifier 20. The matching network 81 matches the impedance between the amplifier 20 and the amplifier 30. The matching network 82 matches the impedance between the amplifier 30 and the subsequent circuit (not illustrated). Each of the matching networks 80 to 82 includes, for example, an inductor and a capacitor.

The power supply circuit 40 generates variable power supply voltages Vcc1 and Vcc2, each of which is controlled in accordance with the envelope of an RF signal, and supplies the variable power supply voltages Vcc1 and Vcc2 to the amplifiers 20 and 30, respectively. Accordingly, the power amplifier module 1 operates in accordance with the so-called envelope tracking (ET) method. The power amplifier module 1 operating in accordance with the ET method provides improved power efficiency compared with, for example, a power amplifier module operating in accordance with an average power tracking (APT) method. The power supply circuit 40 may or may not be included in the power amplifier module 1.

Configuration of Power Amplifier Circuit 10

Power Amplifier Circuit 10 According to Embodiment

Figure 2:
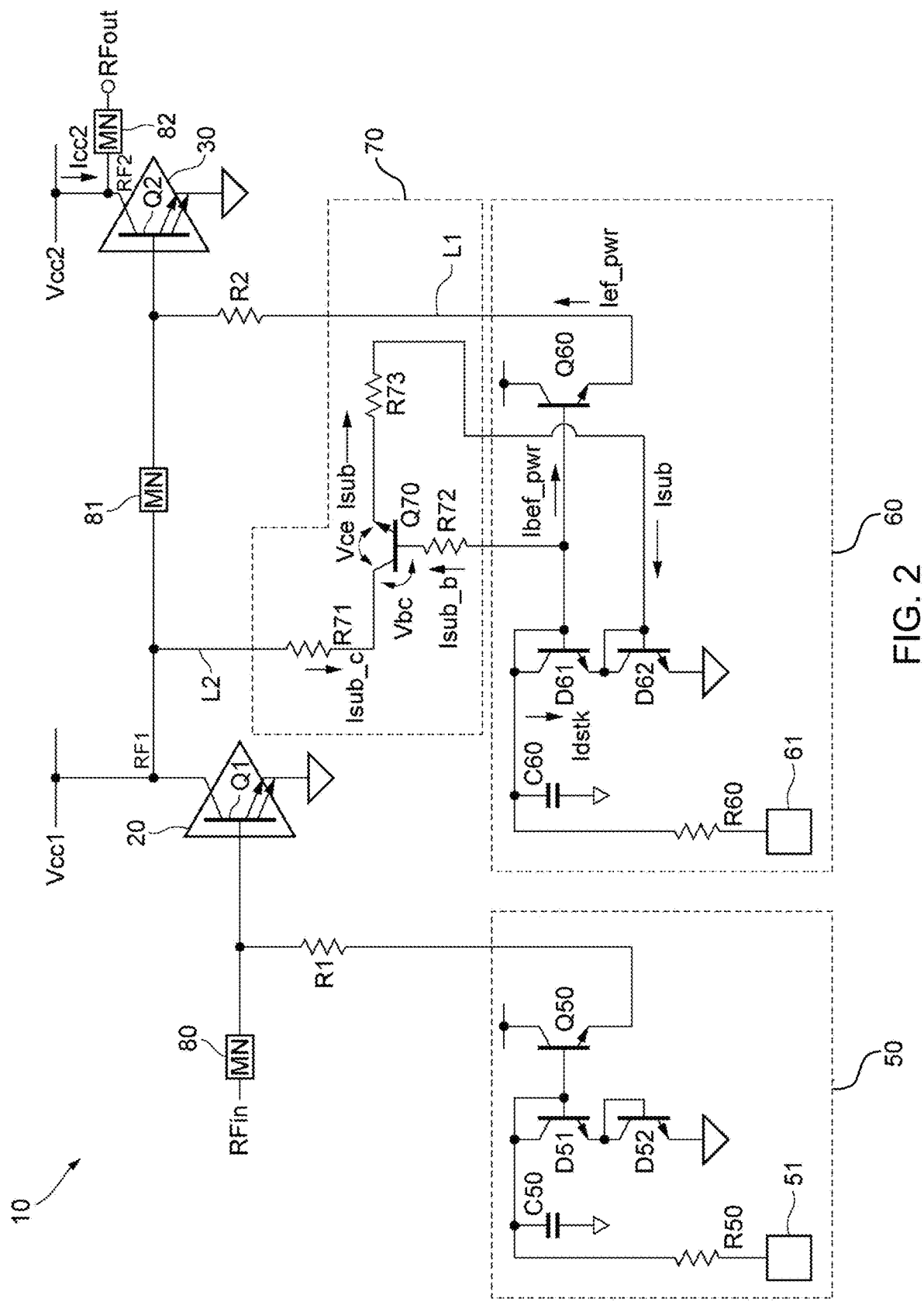
FIG. 2 illustrates an example configuration of the power amplifier circuit according to the embodiment.

FIG. 2 illustrates an example configuration of the power amplifier circuit 10 according to this embodiment.

The amplifiers 20 and 30 include transistors Q1 and Q2, respectively. The transistor Q1 has a collector to which the variable power supply voltage Vcc1 is supplied, a base to which the input signal RFin is supplied via the matching network 80, and an emitter grounded. The RF signal RF1, which is obtained by amplifying the input signal RFin, is outputted from the collector of the transistor Q1. The transistor Q2 (first transistor) has a collector (first terminal) to which the variable power supply voltage Vcc2 (i.e., a voltage corresponding to the variable power supply voltage Vcc1) is supplied, a base (second terminal) to which the RF signal RF1 is supplied via the matching network 81, and an emitter grounded. The RF signal RF2, which is obtained by amplifying the RF signal RF1, is outputted from the collector of the transistor Q2.

The bias circuit 50 supplies a bias current or bias voltage to the base of the transistor Q1 via a resistance element R1 to control a bias point of the transistor Q1. Specifically, the bias circuit 50 includes diodes D51 and D52, a transistor Q50, a resistance element R50, a capacitor C50, and a power supply terminal 51.

The diode D51 and the diode D52 are connected in series. The diodes D51 and D52 may be each constituted by, for example, a diode-connected bipolar transistor. The diode-connected bipolar transistor is a bipolar transistor having a base and a collector that are connected to each other. The diode-connected bipolar transistor behaves as a bipolar element equivalent to a diode. One of the two terminals of a diode-connected bipolar transistor having a higher potential during forward bias is referred to as "anode", and the terminal having a lower potential is referred to as "cathode". It should be noted that each of the diodes D51 and D52 may be constituted by a P-N junction diode instead of a diode-connected bipolar transistor.

A constant voltage or current is supplied to the anode of the diode D51 from the power supply terminal 51 via the resistance element R50. The anode of the diode D51 is connected to ground via the capacitor C50. The anode of the diode D52 is connected to the cathode of the diode D51, and the cathode of the diode D52 is grounded.

The transistor Q50 has a collector to which a battery voltage (power supply voltage), and a base connected to the anode of the diode D51. The transistor Q50 has an emitter connected to the base of the transistor Q1 via the resistance element R1. Accordingly, a bias current is supplied to the base of the transistor Q1.

The bias circuit 60 supplies a bias current or bias voltage to the base of the transistor Q2 via a resistance element R2 to control a bias point of the transistor Q2. Specifically, the bias circuit 60 includes diodes D61 and D62, a transistor Q60, a resistance element R60, a capacitor C60, and a power supply terminal 61. In the following, for convenience of description, the bias circuit 60 supplies a bias current to the transistor Q2.

The diode D61 (first diode) and the diode D62 (second diode) are connected in series. The diodes D61 and D62 may be each constituted by, for example, a diode-connected bipolar transistor. Each of the diodes D61 and D62 may be constituted by a P-N junction diode instead of a diode-connected bipolar transistor.

A constant voltage or current is supplied to the anode of the diode D61 from the power supply terminal 61 via the resistance element R60. The anode of the diode D61 is connected to ground via the capacitor C60. The anode of the diode D62 is connected to the cathode of the diode D61, and the cathode of the diode D62 is grounded. A current Idstk is supplied to the anode of the diode D61 from the power supply terminal 61.

The anode of the diode D62 is connected to the emitter (third terminal) of a transistor Q70 of the adjustment circuit 70 described below. That is, a current Isub is supplied to the anode of the diode D62 from the transistor Q70.

The transistor Q60 (bias transistor) has a collector to which a battery voltage (power supply voltage) is supplied, and a base connected to the anode of the diode D61. The transistor Q60 has an emitter connected to the base of the transistor Q2 via the resistance element R2. Accordingly, a bias current is supplied to the base of the transistor Q2. A current Ibef_pwr is supplied to the base of the transistor Q60.

The adjustment circuit 70 adjusts the bias current to be supplied to the base of the transistor Q2 in accordance with the variable power supply voltage Vcc1. Specifically, the adjustment circuit 70 includes the transistor Q70 and resistors R71 to R73.

The transistor Q70 (adjustment transistor) has a collector (first terminal) connected to the collector of the transistor Q1 via the resistor R71 (first resistor). Accordingly, the variable power supply voltage Vcc1 is supplied to the collector of the transistor Q70 via the resistor R71. The transistor Q70 has a base (second terminal) connected to the base of the transistor Q60 via the resistor R72 (second resistor). The emitter (third terminal) of the transistor Q70 is connected to the cathode of the diode D61 via the resistor R73 (third resistor). In this embodiment, the transistor Q70 is, for example, a heterojunction bipolar transistor with a heterojunction between the emitter and the base thereof. A voltage across the collector and emitter of the transistor Q70 is represented by Vce.

Currents Isub_c, Isub b, and Isub flow through the resistors R71, R72, and R73, respectively. A current Ief_pwr is outputted from the emitter of the transistor Q60. That is, the current Ief_pwr is a bias current to be supplied to the base of the transistor Q2. The current Ief_pwr is hereinafter sometimes referred to as "bias current". A current Icc2 flows through the collector of the transistor Q2.

The following describes a power amplifier circuit 100 according to a comparative example. The power amplifier circuit 100 according to the comparative example is presented to help understand the power amplifier circuit 10 according to this embodiment.

Power Amplifier Circuit 100 According to Comparative Example

Figure 11:
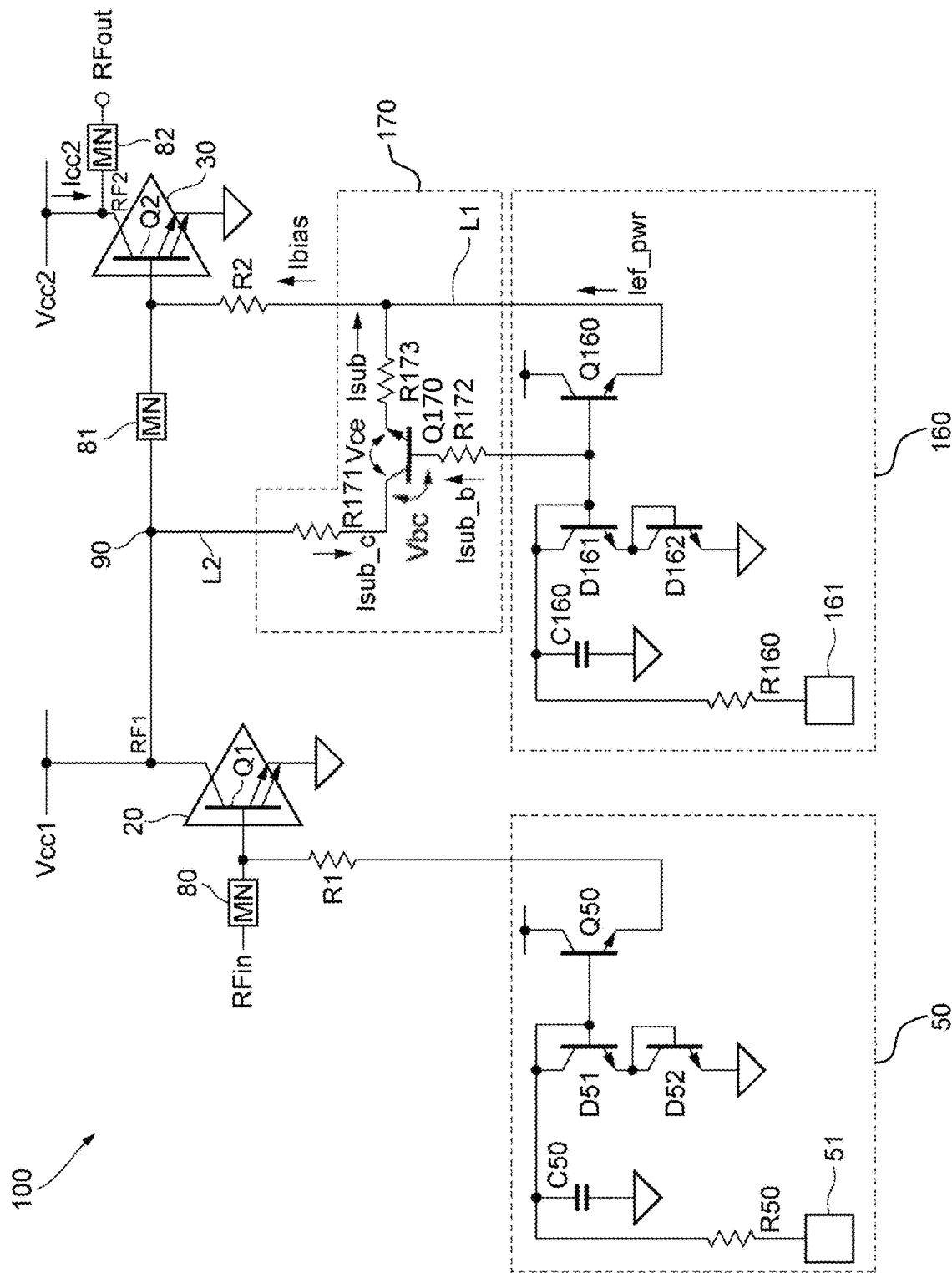
FIG. 11 illustrates a configuration of the power amplifier circuit according to the comparative example.

FIG. 11 illustrates a configuration of the power amplifier circuit 100 according to the comparative example. The power amplifier circuit 100 includes amplifiers 20 and 30, bias circuits 50 and 160, an adjustment circuit 170, and matching networks 80 to 82. In the following, for convenience of description, only components of the power amplifier circuit 100 different from those of the power amplifier circuit 10 will be described. Specifically, the bias circuit 160 and the adjustment circuit 170 of the power amplifier circuit 100 will be described.

The bias circuit 160 supplies a bias current or bias voltage to the base of the transistor Q2 via the resistance element R2 to control a bias point of the transistor Q2. Specifically, the bias circuit 160 includes diodes D161 and D162, a transistor Q160, a resistance element R160, a capacitor C160, and a power supply terminal 161.

The diode D161 and the diode D162 are connected in series. The diodes D161 and D162 may be each constituted by, for example, a diode-connected bipolar transistor.

A constant voltage or current is supplied to the anode of the diode D161 from the power supply terminal 161 via the resistance element R160. The anode of the diode D161 is connected to ground via the capacitor C160. The anode of the diode D162 is connected to the cathode of the diode D161, and the cathode of the diode D162 is grounded.

The transistor Q160 has a collector to which a battery voltage (power supply voltage) is supplied, and a base connected to the anode of the diode D161. The transistor Q160 has an emitter connected to the base of the transistor Q2 via the resistance element R2. Accordingly, a bias current is supplied to the base of the transistor Q2.

The adjustment circuit 170 adjusts a bias current to be supplied to the base of the transistor Q2 in accordance with the variable power supply voltage Vcc1. Specifically, the adjustment circuit 170 includes a transistor Q170 and variable resistors R171 to R173.

The transistor Q170 has a collector to which the variable power supply voltage Vcc1 is supplied via the variable resistor R171. The transistor Q170 has a base connected to the base of the transistor Q160 via the variable resistor R172. The transistor Q170 has an emitter connected to the base of the transistor Q2 via the variable resistor R173 and the resistance element R2. The emitter of the transistor Q170 is also connected to the emitter of the transistor Q160 via the variable resistor R173. It is assumed here that, for example, the transistor Q170 is a heterojunction bipolar transistor with a heterojunction between the emitter and the base thereof and that the bandgap of the emitter is larger than the bandgap of the base.

As illustrated in FIG. 11, a bias current Ibias is supplied to the transistor Q2, a current Ief_pwr is supplied from the emitter of the transistor Q160, and a current Isub is supplied from the emitter of the transistor Q170. The current Ibias is determined by the sum of the current Ief_pwr and the current Isub.

Figure 12:
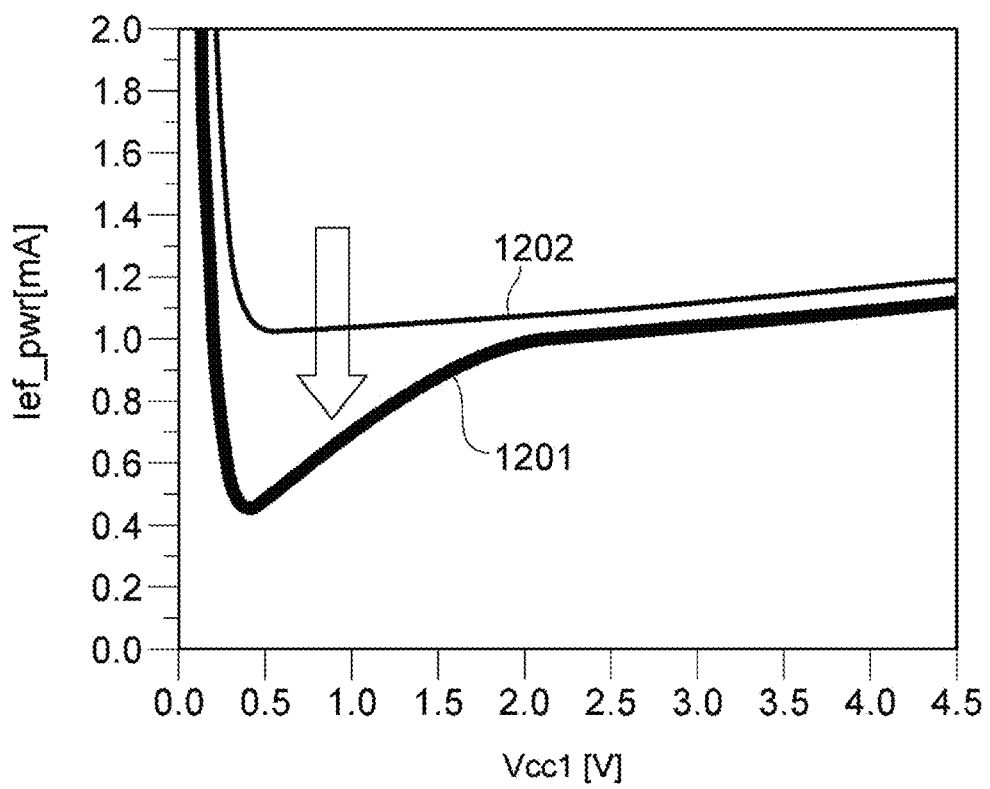
FIG. 12 is a graph illustrating an improvement in current $Ief\_pwr$ in the power amplifier circuit according to the comparative example.
Figure 13:
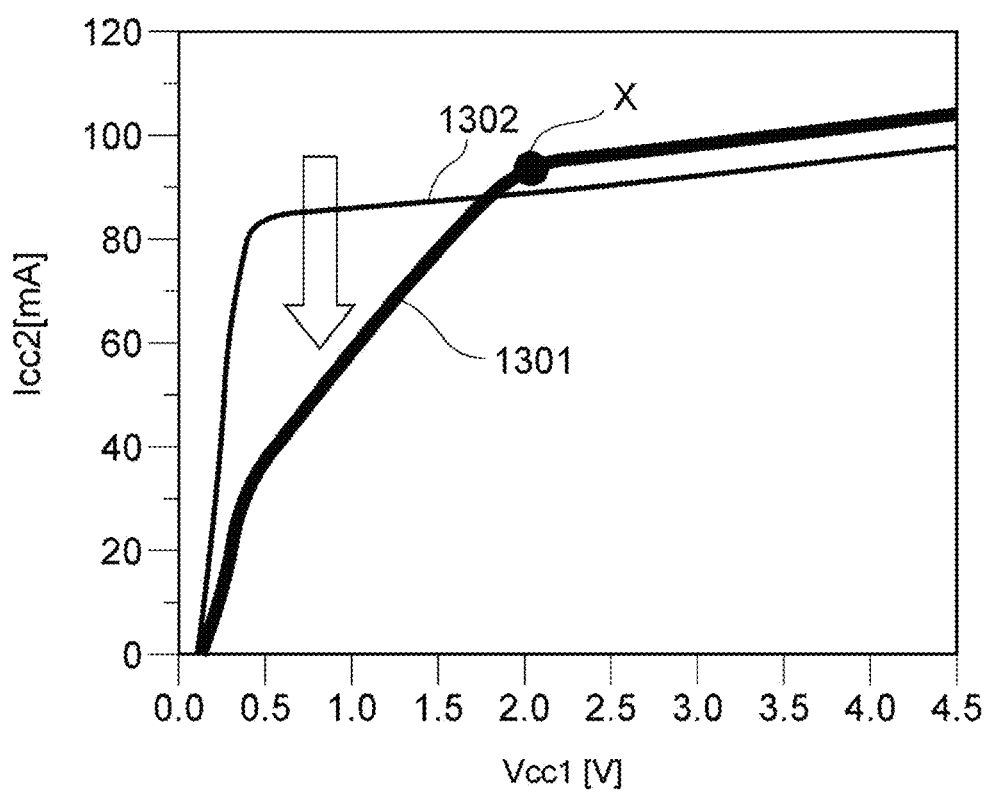
FIG. 13 is a graph illustrating an improvement in current $Icc2$ in the power amplifier circuit according to the comparative example.

The following describes a mechanism for improving the gain dispersion in the power amplifier circuit 100 according to the comparative example with reference to FIGS. 12 and 13.

FIG. 12 is a graph illustrating an improvement in the current Ief_pwr in the power amplifier circuit 100 according to the comparative example. In FIG. 12, the horizontal axis represents the variable power supply voltage Vcc1, and the vertical axis represents the current Ief_pwr. In the graph illustrated in FIG. 12, line 1201 indicates the relationship between the current Ief_pwr and the variable power supply voltage Vcc1 in the power amplifier circuit 100. In the graph illustrated in FIG. 12, line 1202 indicates the relationship between the variable power supply voltage Vcc1 and the current Ief_pwr when the power amplifier circuit 100 does not include the adjustment circuit 170.

FIG. 13 is a graph illustrating an improvement in the current Icc2 in the power amplifier circuit 100 according to the comparative example. In FIG. 13, the horizontal axis represents the variable power supply voltage Vcc1, and the vertical axis represents the current Icc2 flowing through the collector of the transistor Q2. In the graph illustrated in FIG. 13, line 1301 indicates the relationship between the current Icc2 and the variable power supply voltage Vcc1 in the power amplifier circuit 100. In the graph illustrated in FIG. 13, line 1302 indicates the relationship between the current Icc2 and the variable power supply voltage Vcc1 when the power amplifier circuit 100 does not include the adjustment circuit 170.

As illustrated in FIG. 12, due to the operation of the adjustment circuit 170, the current Ief_pwr of the power amplifier circuit 100 decreases in a low-potential region of the variable power supply voltage Vcc1. The low-potential region is less than 2 V, for example, and this also applies to the following description. Accordingly, as illustrated in FIG. 13, the current Icc2, which changes in accordance with the value of the current Ief_pwr inputted to the base of the transistor Q2, decreases in the low-potential region of the variable power supply voltage Vcc1.

It is therefore possible to decrease the current Ief_pwr to a required level in the low-potential region of the variable power supply voltage Vcc1. Since the linearity of the current Icc2 can be obtained in the low-potential region of the variable power supply voltage Vcc1, the gain dispersion characteristic can be improved.

However, as illustrated in FIG. 13, the current Icc2 has a current change point X at which the rate (slope) of the change in the current Icc2 relative to the variable power supply voltage Vcc1 becomes less steep. This is because it is difficult to maintain the linearity of the current Icc2 since the current Ief_pwr is not increased in a high-potential region of the variable power supply voltage Vcc1, compared with the current Ief_pwr obtained when the power amplifier circuit 100 does not include the adjustment circuit 170. The high-potential region is higher than or equal to 2 V, for example, and this also applies to the following description. This indicates that even if the adjustment circuit 170 is provided, the bias current to be supplied to the base of the transistor Q2 is not increased in the high-potential region of the variable power supply voltage Vcc1. The gain dispersion characteristic thus deteriorates.

A technique for increasing the bias current Ibias to be supplied to the base of the transistor Q2 will now be described. As described above, the bias current Ibias is determined by the sum of the current Ief_pwr and the current Isub. That is, it is required to increase the current Ief_pwr or the current Isub to increase the bias current Ibias.

Figure 14:
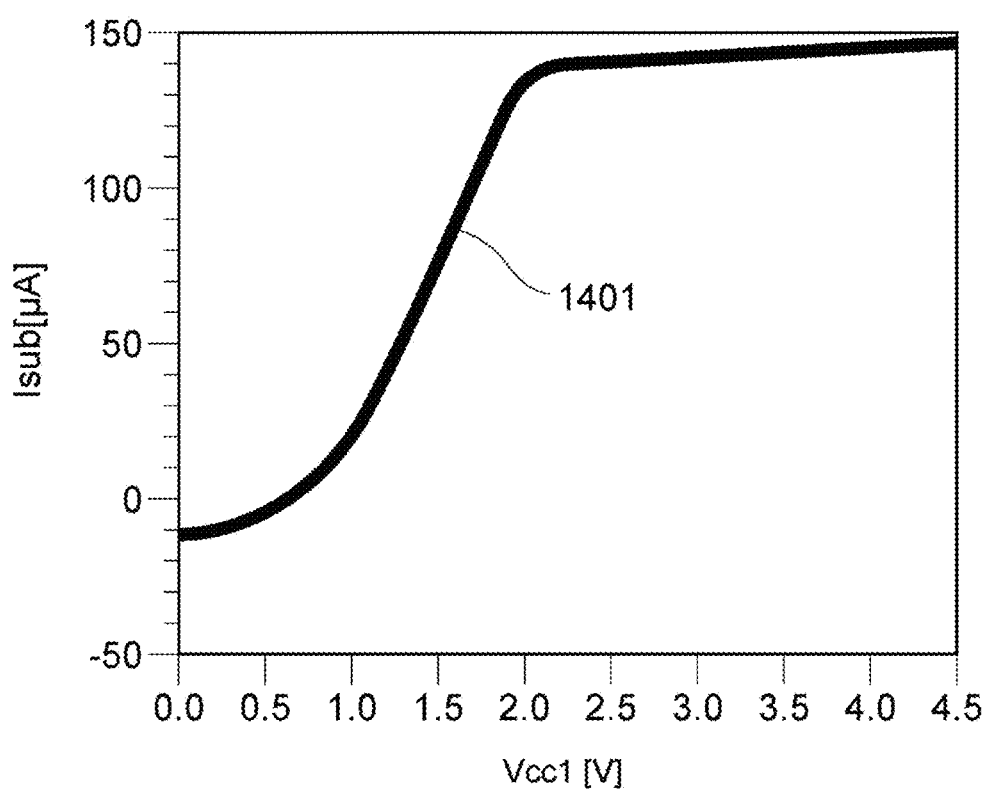
FIG. 14 is a graph illustrating a current $Isub$ in the power amplifier circuit according to the comparative example.

FIG. 14 is a graph illustrating the current Isub in the power amplifier circuit 100 according to the comparative example. In FIG. 14, the horizontal axis represents the variable power supply voltage Vcc1, and the vertical axis represents the current Isub. In the graph illustrated in FIG. 14, line 1401 indicates the relationship between the current Isub and the variable power supply voltage Vcc1 in the power amplifier circuit 100. The current Isub flowing through the transistor Q170 is determined by the size of the transistor Q170. If the size of the transistor Q170 is increased, the layout area of the adjustment circuit 170 is increased.

In addition, due to the effect of the resistance element R2 connected to the emitter of the transistor Q170, the emitter voltage of the transistor Q170 increases. That is, even if the size of the transistor Q170 is increased, a voltage Vbc across the base and collector of the transistor Q170 is less likely to be increased, and the current Isub_c is less likely to be increased. That is, in the power amplifier circuit 100, even if the size of the transistor Q170 is increased, the current Isub is less likely to be increased. The resistance element R2 is determined on the basis of the frequency characteristics of the power amplifier circuit 100, and is thus difficult to adjust for gain dispersion adjustment.

Operation of Power Amplifier Circuit 10

Next, the operation of the power amplifier circuit 10 will be described with reference to FIGS. 3 to 7.

Figure 3:
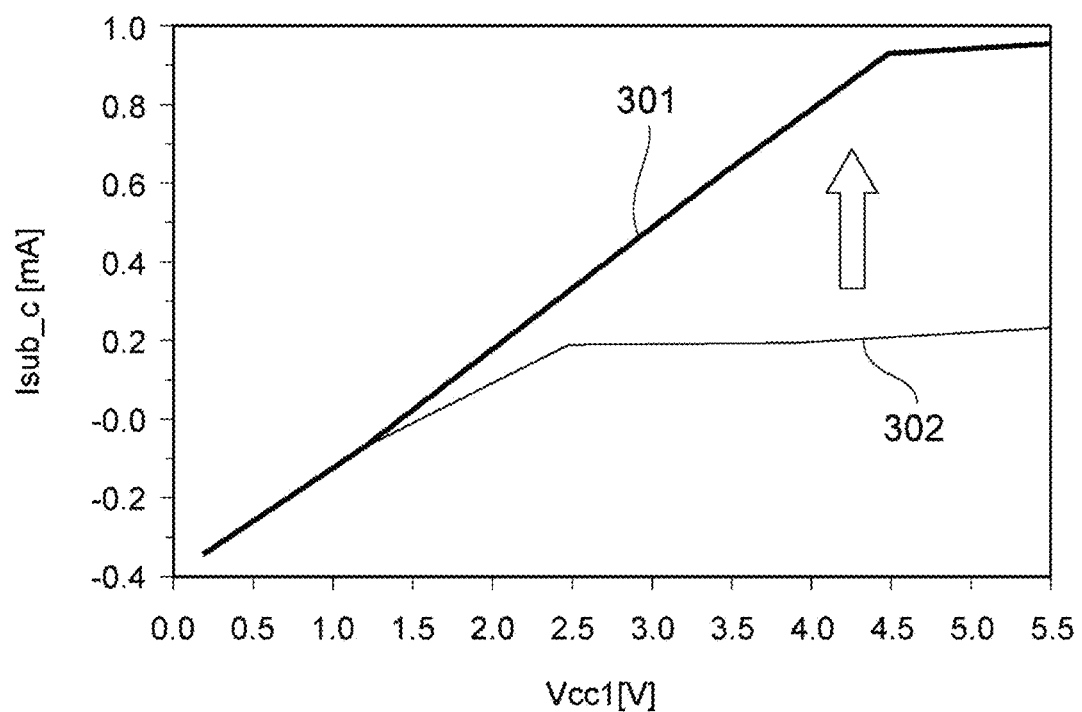
FIG. 3 is a graph illustrating the relationship between a variable power supply voltage $Vcc1$ and a current $Isub\_c$.
Figure 4:
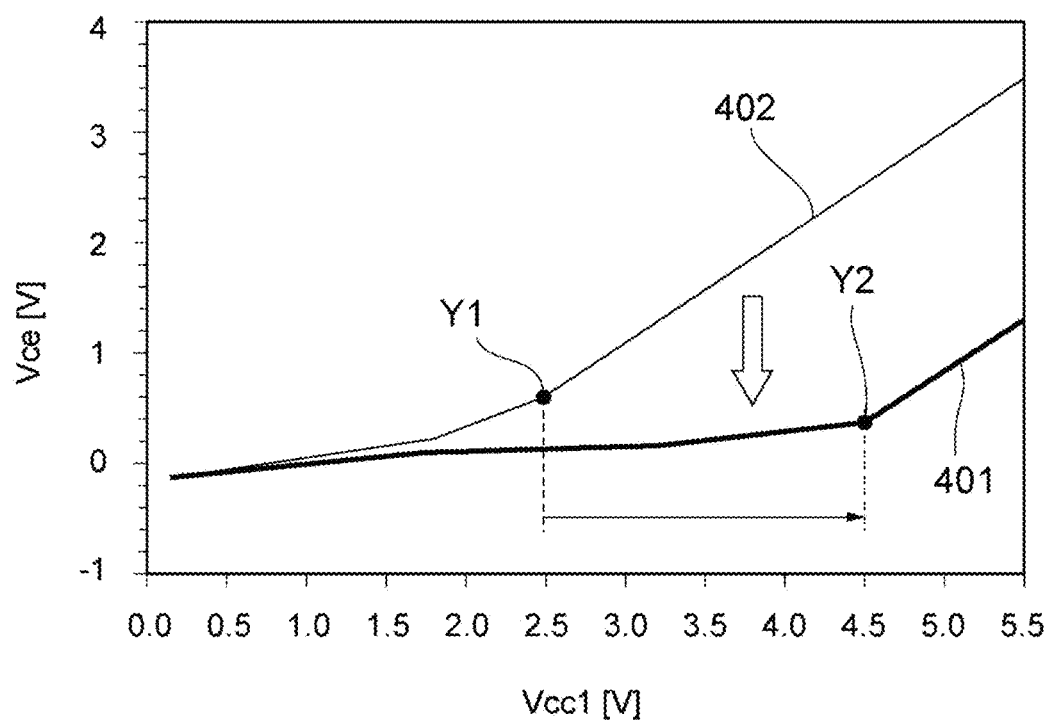
FIG. 4 is a graph illustrating the relationship between the variable power supply voltage $Vcc1$ and a voltage $Vce$.
Figure 5:
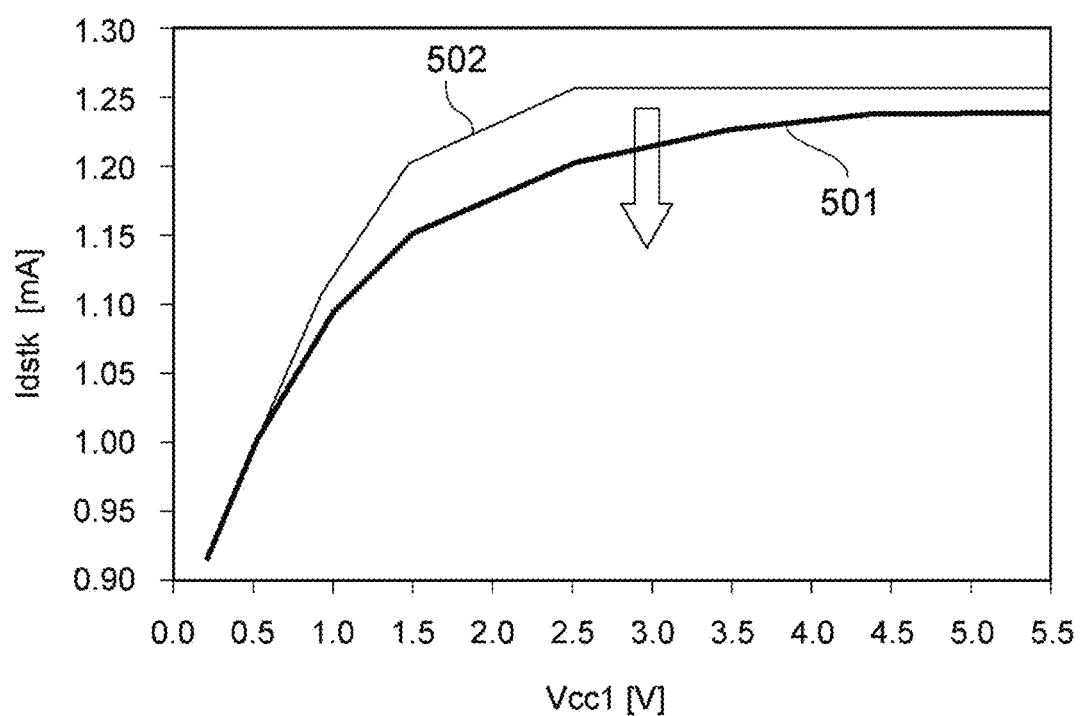
FIG. 5 is a graph illustrating the relationship between the variable power supply voltage $Vcc1$ and a current $Idstk$.
Figure 6:
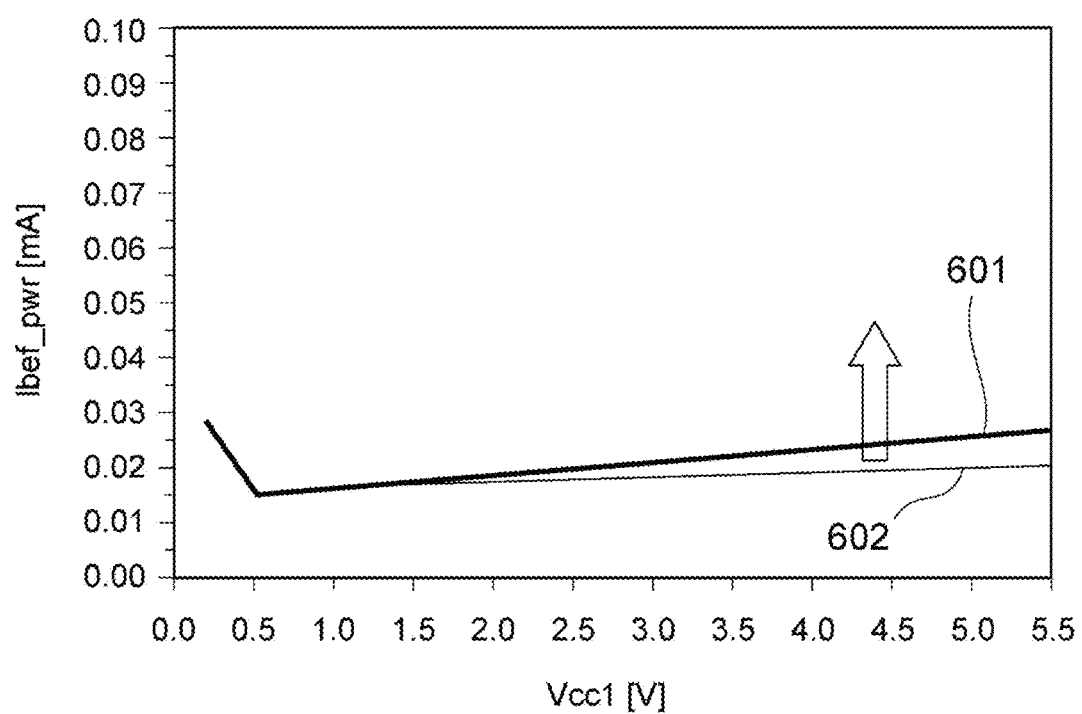
FIG. 6 is a graph illustrating the relationship between the variable power supply voltage $Vcc1$ and a current $Ibef\_pwr$.
Figure 7:
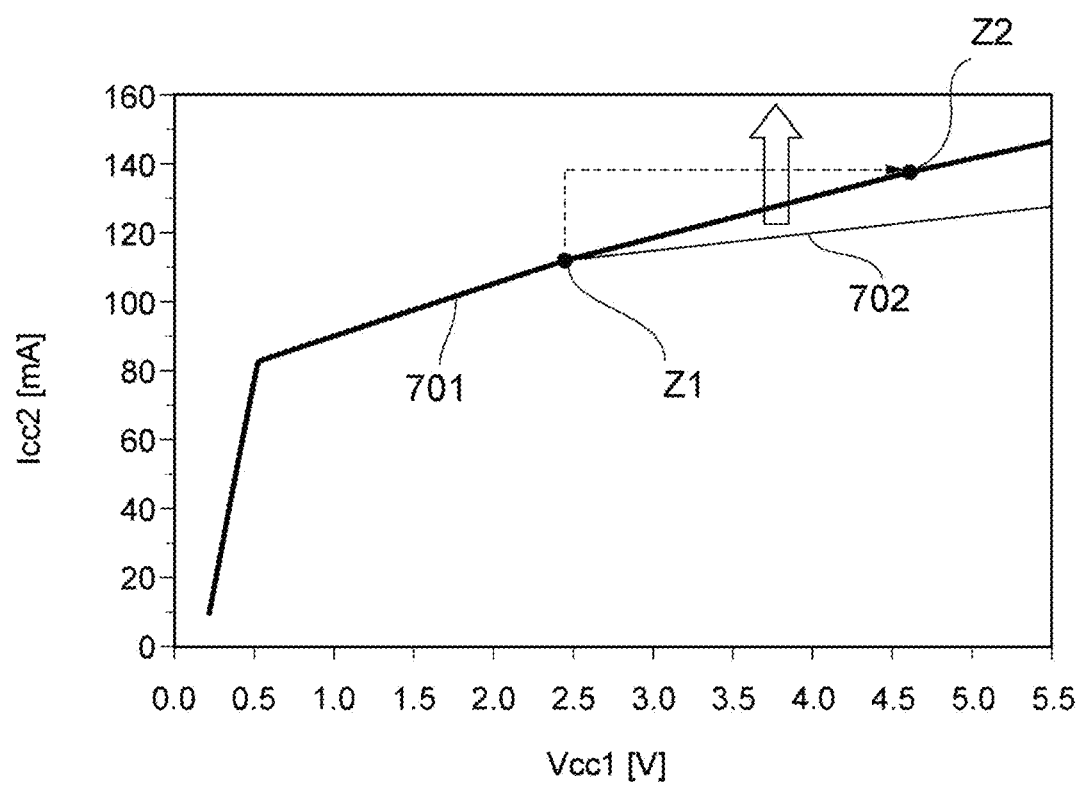
FIG. 7 is a graph illustrating the relationship between the variable power supply voltage $Vcc1$ and a current $Icc2$.

FIG. 3 is a graph illustrating the relationship between the variable power supply voltage Vcc1 and the current Isub_c. In FIG. 3, the horizontal axis represents the variable power supply voltage Vcc1, and the vertical axis represents the current Isub_c. In the graph illustrated in FIG. 3, line 301 indicates the relationship between the current Isub_c and the variable power supply voltage Vcc1 in the power amplifier circuit 10, and line 302 indicates the relationship between the current Isub_c and the variable power supply voltage Vcc1 in the power amplifier circuit 100 according to the comparative example. FIG. 4 is a graph illustrating the relationship between the variable power supply voltage Vcc1 and the voltage Vce. In FIG. 4, the horizontal axis represents the variable power supply voltage Vcc1, and the vertical axis represents the voltage Vce. In the graph illustrated in FIG. 4, line 401 indicates the relationship between the voltage Vce across the collector and emitter of the transistor Q70 and the variable power supply voltage Vcc1 in the power amplifier circuit 10, and line 402 indicates the relationship between the voltage Vce across the collector and emitter of the transistor Q170 and the variable power supply voltage Vcc1 in the power amplifier circuit 100 according to the comparative example. FIG. 5 is a graph illustrating the relationship between the variable power supply voltage Vcc1 and the current Idstk. In FIG. 5, the horizontal axis represents the variable power supply voltage Vcc1, and the vertical axis represents the current Idstk. In the graph illustrated in FIG. 5, line 501 indicates the relationship between the current Idstk and the variable power supply voltage Vcc1 in the power amplifier circuit 10, and line 502 indicates the relationship between the current Idstk and the variable power supply voltage Vcc1 in the power amplifier circuit 100 according to the comparative example. FIG. 6 is a graph illustrating the relationship between the variable power supply voltage Vcc1 and the current Ibef_pwr. In FIG. 6, the horizontal axis represents the variable power supply voltage Vcc1, and the vertical axis represents the current Ibef_pwr. In the graph illustrated in FIG. 6, line 601 indicates the relationship between the current Ibef_pwr and the variable power supply voltage Vcc1 in the power amplifier circuit 10, and line 602 indicates the relationship between the current Ibef_pwr and the variable power supply voltage Vcc1 in the power amplifier circuit 100 according to the comparative example. FIG. 7 is a graph illustrating the relationship between the variable power supply voltage Vcc1 and the current Icc2. In FIG. 7, the horizontal axis represents the variable power supply voltage Vcc1, and the vertical axis represents the current Icc2. In the graph illustrated in FIG. 7, line 701 indicates the relationship between the current Icc2 and the variable power supply voltage Vcc1 in the power amplifier circuit 10, and line 702 indicates the relationship between the current Icc2 and the variable power supply voltage Vcc1 in the power amplifier circuit 100 according to the comparative example.

First, the principle that the current Isub_c in the power amplifier circuit 10 according to this embodiment is increased compared with the current Isub_c in the power amplifier circuit 100 according to the comparative example will be described with reference to FIG. 3.

In the power amplifier circuit 10, as described above, the emitter of the transistor Q70 is connected to the anode of the diode D62. Accordingly, the emitter potential of the transistor Q70 can be reduced and thus a base-emitter voltage Vbe of the diode D62 can be increased, compared with the power amplifier circuit 100. Thus, in the power amplifier circuit 10, as illustrated in FIG. 3, the current Isub_c to be inputted to the collector of the transistor Q70 can be increased compared with the power amplifier circuit 100.

In a different viewpoint, since the emitter of the transistor Q70 of the adjustment circuit 70 is connected to the anode of the diode D62 via the resistor R73, the current Isub_c to be inputted to the collector of the transistor Q70 is determined based on the emitter size ratio of the transistor Q70 and the diode D61. That is, if the size of the transistor Q70 is larger than the size of the diode D61, the current Isub_c can be increased. In the power amplifier circuit 100 according to the comparative example, in contrast, because of the connection relationship among the transistor Q160, the transistor Q170, and the transistor Q2, if the size of the transistor Q160 is smaller than the size of the transistor Q170, most of the current Ibias is the current Ief_pwr supplied from the transistor Q160. That is, the power amplifier circuit 10 can increase the current Isub_c without changing the size of the transistor Q70.

In the power amplifier circuit 10, furthermore, since the emitter of the transistor Q70 is connected to the anode of the diode D62, the current Isub_c can be adjusted by adjusting the resistor R73, regardless of the resistance element R2.

Next, the principle that the saturation region of the transistor Q70 of the adjustment circuit 70 is extended to the high-potential region of the variable power supply voltage Vcc1, compared with the power amplifier circuit 100 according to the comparative example, will be described with reference to FIGS. 3 and 4.

In the power amplifier circuit 10, as described above, the current Isub_c to be inputted to the collector of the transistor Q70 can be increased. Accordingly, the voltage drop across the resistor R72 is increased, and the voltage Vce across the collector and emitter of the transistor Q70 is decreased. The transistor Q70 thus operates in the saturation region. In the saturation region, as illustrated in FIG. 3, as the variable power supply voltage Vcc1 is increased, the current Isub_c to be inputted to the collector of the transistor Q70 is also increased (for example, in a region where the variable power supply voltage Vcc1 is less than or equal to about 4.5 V). That is, the current Isub_c depends on the variable power supply voltage Vcc1. Accordingly, as the variable power supply voltage Vcc1 is further increased, the current Isub_c is also increased, resulting in a further increase in the voltage drop across the resistor R71. Due to this operation, as illustrated in FIG. 4, the saturation region of the transistor Q70 can be extended to the high-potential region of the variable power supply voltage Vcc1. That is, in the power amplifier circuit 10, a voltage change point of the voltage Vce across the transistor Q70 can be shifted to Y2 from Y1 for that in the power amplifier circuit 100.

Next, the principle that the extension of the saturation region of the transistor Q70 of the adjustment circuit 70 to the high-potential region of the variable power supply voltage Vcc1 shifts a current change point Z1 of the current Icc2, described below, to the high-potential region of the variable power supply voltage Vcc1 will be described with reference to FIGS. 5 to 7.

As described above, in the saturation region of the transistor Q70, the current Isub_c is increased as the variable power supply voltage Vcc1 is increased. In the power amplifier circuit 10, the current Isub, which depends on the current Isub_c, is inputted to the anode of the diode D62. In the bias circuit 60, the current Idstk increases the base-emitter voltage Vbe of the diode D62. That is, when the current Isub is inputted to the anode of the diode D62, as illustrated in FIG. 5, the current Idstk for increasing the voltage Vbe across the diode D62 can be compensated for by the current Isub_c. As illustrated in FIG. 6, in the bias circuit 60, a portion of the current Idstk is added to the current Ibef_pwr to be inputted to the base of the transistor Q60 in accordance with the current Isub that compensates for the current Idstk. Accordingly, as illustrated in FIG. 7, the rate (slope) of the change in the current Icc2 relative to the variable power supply voltage Vcc1 can be increased in the saturation region of the transistor Q70. Thus, the current change point Z1 can be shifted to a current change point Z2. That is, in the power amplifier circuit 10, the current change point of the current Icc2 can be shifted to the high-potential region, like the voltage change point of the voltage Vce across the transistor Q70.

Figure 8A:
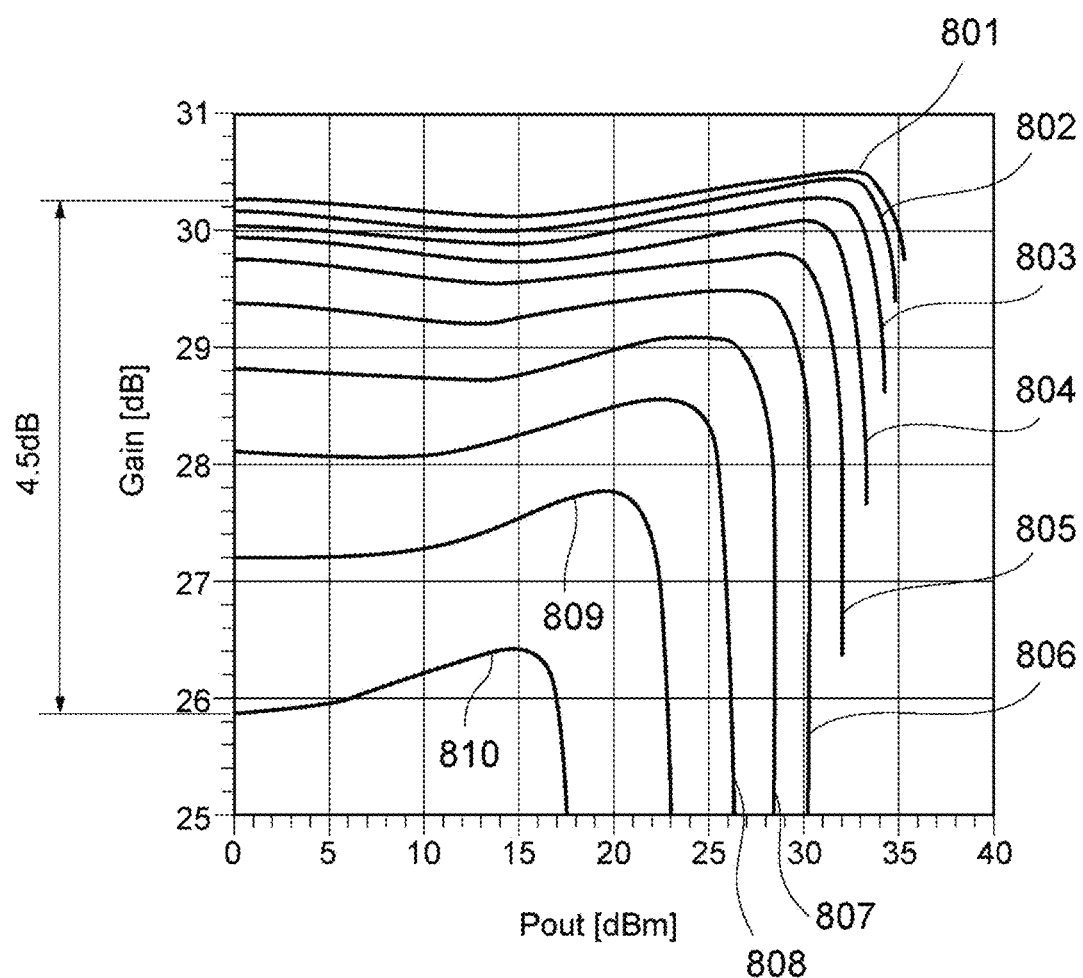
FIG. 8A is a graph illustrating the relationship between the output power and gain of the power amplifier circuit according to the embodiment.
Figure 8B:
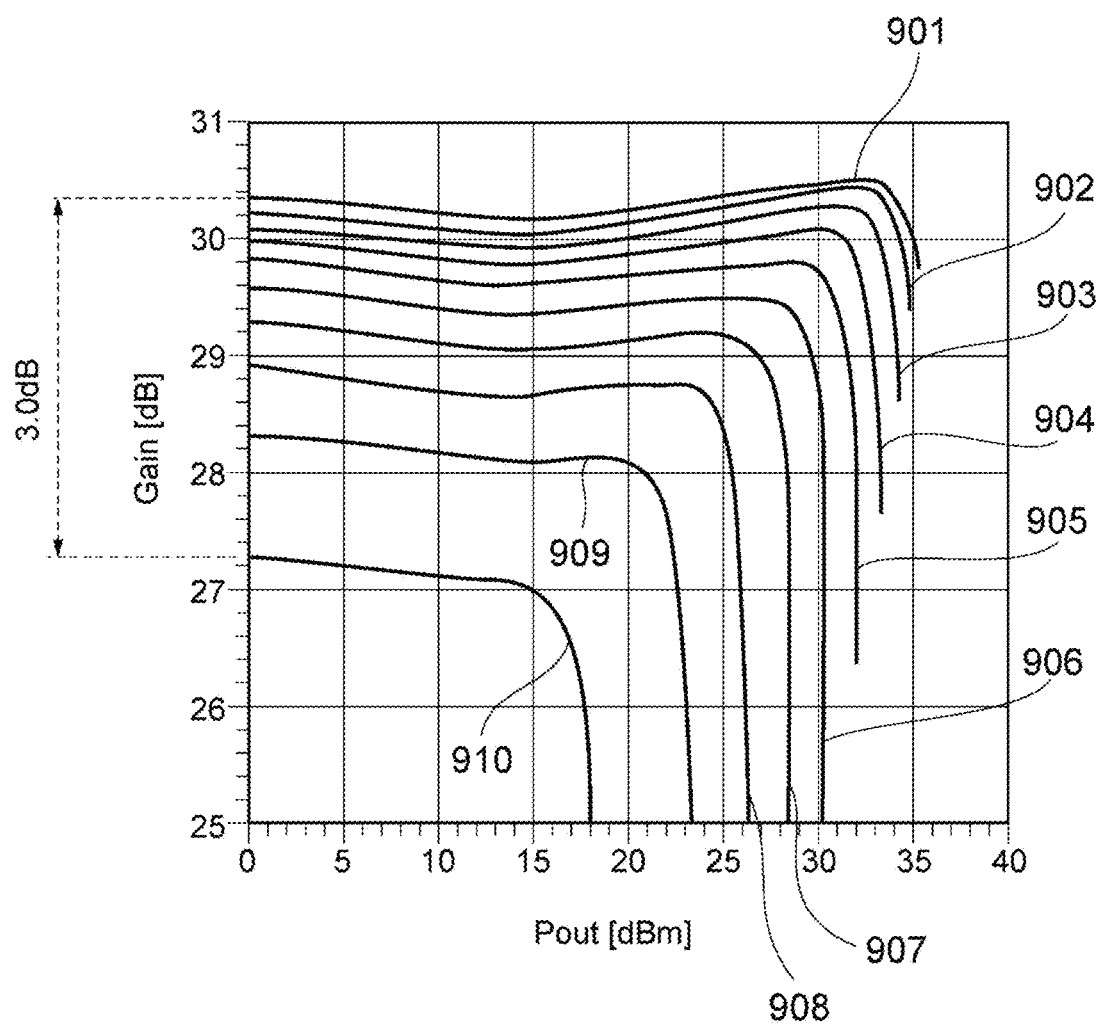
FIG. 8B is a graph illustrating the relationship between the output power and gain of a power amplifier circuit according to a comparative example.

Next, an improvement in the gain dispersion characteristic of a power amplifier circuit will be described with reference to FIGS. 8A and 8B. FIG. 8A is a graph illustrating the relationship between the output power and gain of the power amplifier circuit 10 according to this embodiment. FIG. 8B is a graph illustrating the relationship between the output power and gain of the power amplifier circuit 100 according to the comparative example. In FIGS. 8A and 8B, the horizontal axis represents an output power Pout (dBm), and the vertical axis represents gain (dB).

In the graph illustrated in FIG. 8A, lines 801, 802, 803, 804, 805, 806, 807, 808, 809, and 810 indicate the relationship between the gain and output power of the power amplifier circuit 10 when the variable power supply voltage Vcc1 is set to 5.0 V, 4.5 V, 4.0 V, 3.5 V, 3.0 V, 2.5 V, 2.0 V, 1.5 V, 1.0 V, and 0.6 V, respectively. In the graph illustrated in FIG. 8B, lines 901, 902, 903, 904, 905, 906, 907, 908, 909, and 910 indicate the relationship between the gain and output power of the power amplifier circuit 100 according to the comparative example when the variable power supply voltage Vcc1 is set to 5.0 V, 4.5 V, 4.0 V, 3.5 V, 3.0 V, 2.5 V, 2.0 V, 1.5 V, 1.0 V, and 0.6 V, respectively.

The simulation results illustrated in FIG. 8A indicate that the gain dispersion in the power amplifier circuit 10 is about 4.5 dB. The simulation results illustrated in FIG. 8B indicate that the gain dispersion in the power amplifier circuit 100 according to the comparative example is about 3.0 dB. Accordingly, the gain dispersion in the power amplifier circuit 10 can be larger than that in the power amplifier circuit 100 according to the comparative example by about 1.5 dB.

It should be noted that, as illustrated in FIGS. 3 to 8A, the range of the variable power supply voltage Vcc1 to be supplied to the collector of the transistor Q2 is not necessarily limited to the range presented in the simulation. While the variable power supply voltage Vcc1 is used in the foregoing description, the variable power supply voltage Vcc1 and the variable power supply voltage Vcc2 are common in this embodiment, and the description about the variable power supply voltage Vcc1 also applies to the variable power supply voltage Vcc2.

Power Amplifier Circuits According to Modifications

Figure 9:
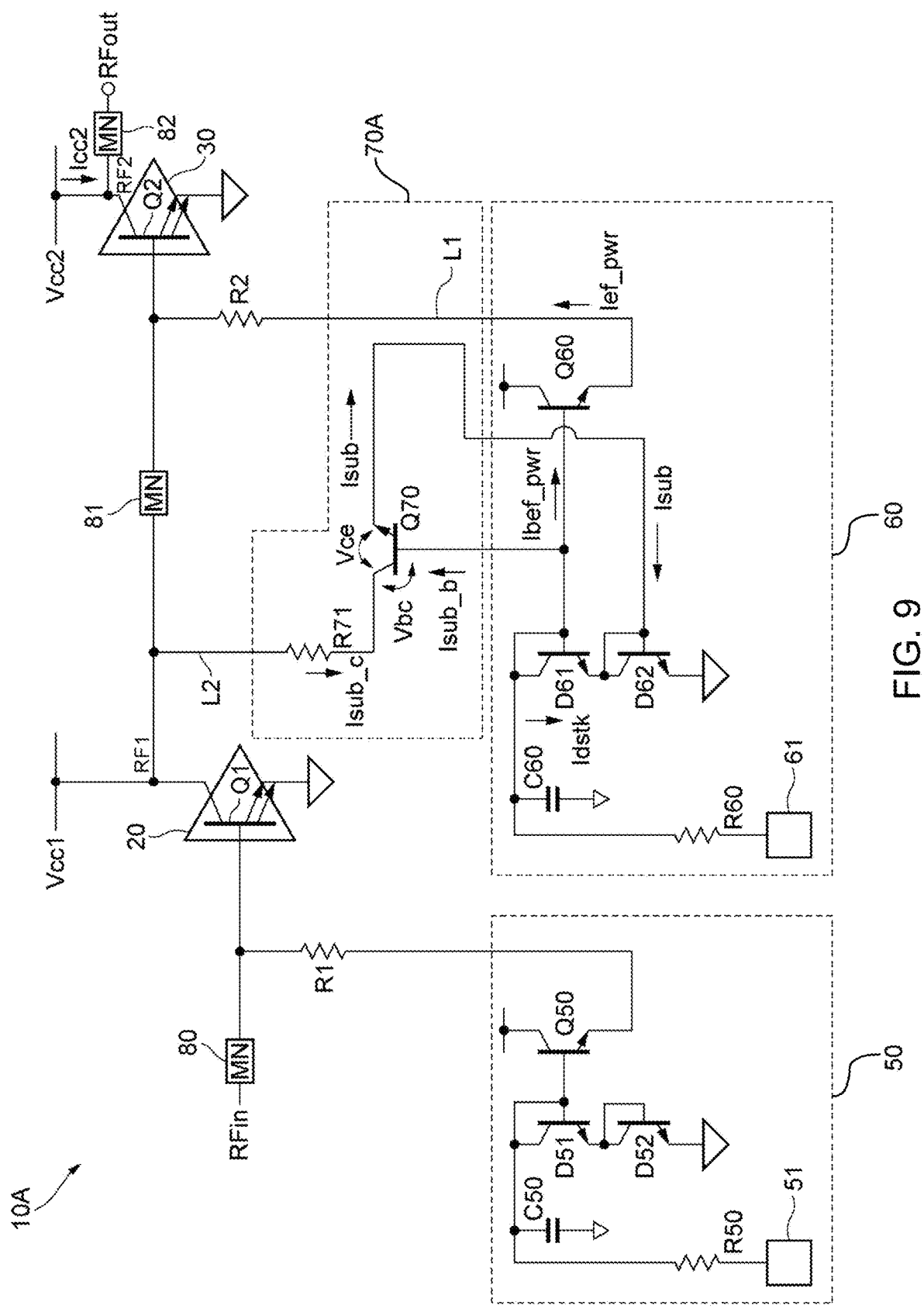
FIG. 9 illustrates an example configuration of a power amplifier circuit according to a modification.
Figure 10:
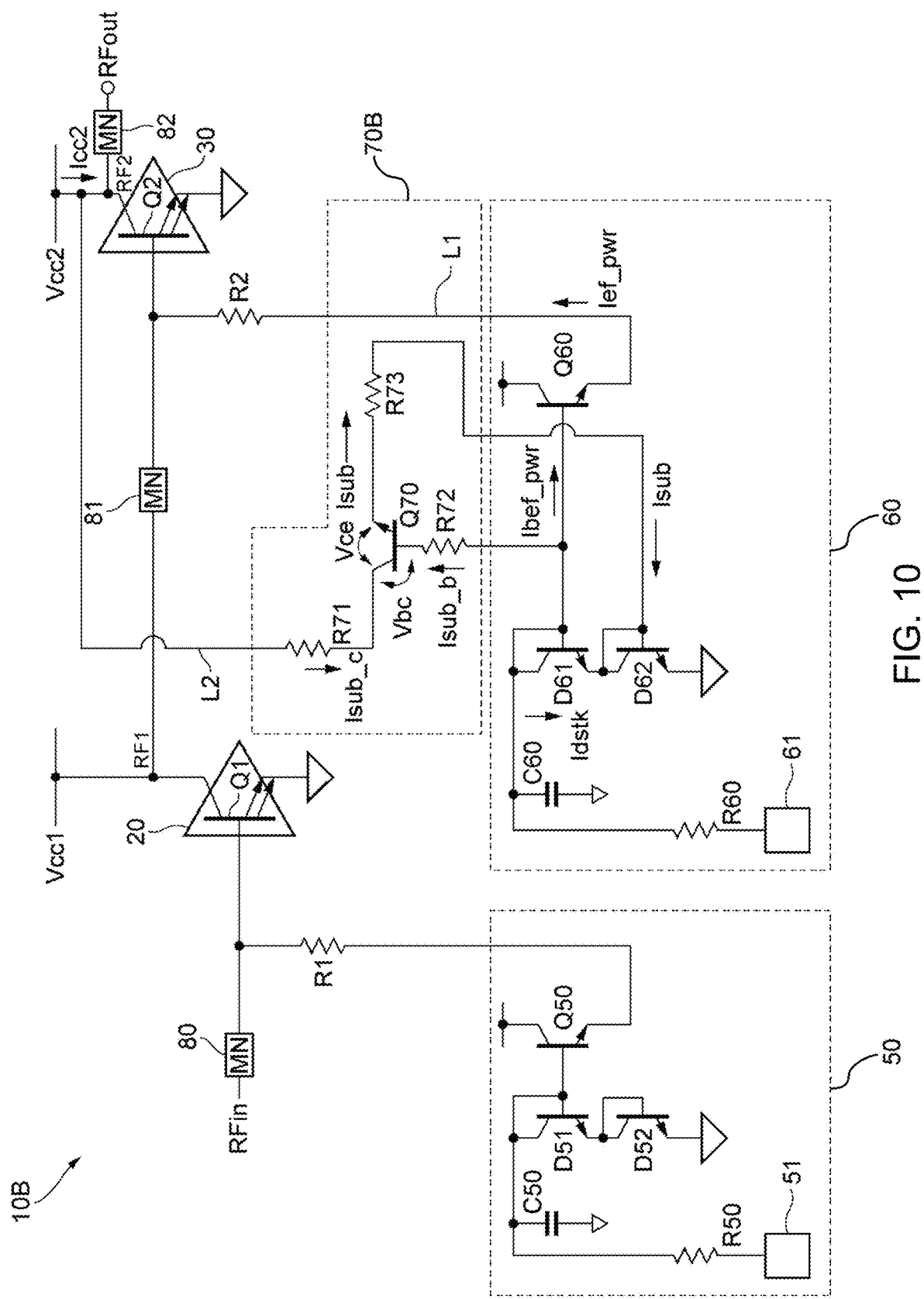
FIG. 10 illustrates an example configuration of a power amplifier circuit according to a modification.

FIGS. 9 and 10 are diagrams illustrating an example configuration of power amplifier circuits 10A and 10B according to modifications. In the modifications, the description of the matters common to the embodiment described above is omitted, and only the differences will be described. In particular, similar operations and effects achieved with similar configurations will not be described individually.

As illustrated in FIG. 9, the power amplifier circuit 10A is different from the power amplifier circuit 10 illustrated in FIG. 2 in that the power amplifier circuit 10A includes an adjustment circuit 70A in which the resistor R72 (second resistor) is not connected to the base (second terminal) of the transistor Q70 and the resistor R73 (third resistor) is not connected to the emitter (third terminal) of the transistor Q70. The power amplifier circuit 10A may not include one of the resistor R72 and the resistor R73. With the configuration described above, the value of the current Icc2 can be adjusted by adjusting the value of the current Isub_c, and the gain dispersion range can be adjusted.

Specifically, in a case where the resistor R72 (second resistor) is not connected to the base (second terminal) of the transistor Q70 of the adjustment circuit 70A, the current Isub b to be supplied to the base of the transistor Q70 is increased, and the current Isub_c is increased, compared with the power amplifier circuit 10 illustrated in FIG. 2. Accordingly, the voltage Vce across the collector and emitter of the transistor Q70 is decreased, and the current Icc2 is increased. In this way, the gain dispersion characteristic can be adjusted.

In a case where the resistor R73 (third resistor) is not connected to the emitter (third terminal) of the transistor Q70 of the adjustment circuit 70A, the current Isub to be supplied to the anode of the diode D62 is increased compared with the power amplifier circuit 10 illustrated in FIG. 2. Accordingly, the current Idstk to be supplied to the diode D61 is decreased, the current Ibef_pwr is increased, and the current Icc2 is increased. In this way, the gain dispersion characteristic can be adjusted.

As illustrated in FIG. 10, the power amplifier circuit 10B includes an adjustment circuit 70B in which a voltage is supplied to the transistor Q70 from a different source from that in the power amplifier circuit 10 illustrated in FIG. 2. Specifically, in the power amplifier circuit 10B, the variable power supply voltage Vcc2 to be supplied to the transistor Q2 is supplied to the collector of the transistor Q70 via the variable resistor R71. That is, in this modification, a path is formed, which extends from the bias circuit 60 to the variable power supply voltage Vcc2 through the variable resistor R72, the base and collector of the transistor Q70, and the variable resistor R71.

Even with the configuration described above, the power amplifier circuit 10B can achieve advantages similar to those of the power amplifier circuit 10 described above. In the power amplifier circuit 10B, similar advantages can be achieved even when, for example, the power supply voltage to be supplied to the transistor Q1 in the initial stage is a fixed voltage and the power supply voltage to be supplied to the transistor Q2 in the subsequent stage is a variable power supply voltage. The fixed voltage to be supplied to the transistor Q1 is a voltage that does not vary in accordance with the envelope of an RF signal, and may be, for example, a voltage based on the APT method.

Power Amplifier Circuits According to Other Modifications

Figure 15:
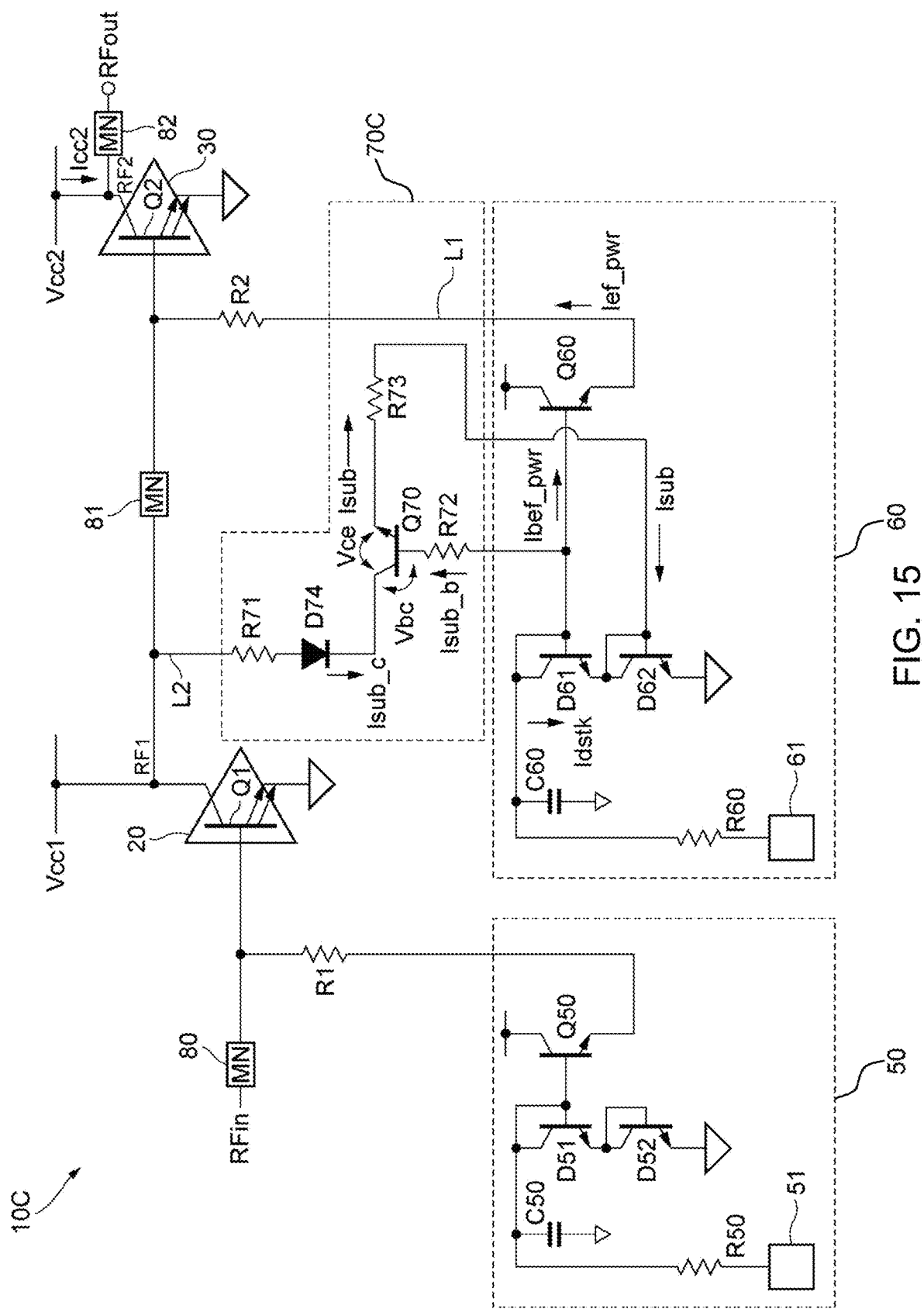
FIG. 15 illustrates an example configuration of a power amplifier circuit according to a modification.

FIG. 15 illustrates an example configuration of a power amplifier circuit 10C according to a modification. In this modification, the description of the matters common to the embodiment described above is omitted, and only the differences will be described. In particular, similar operations and effects achieved with similar configurations will not be described individually.

As illustrated in FIG. 15, unlike the power amplifier circuit 10 illustrated in FIG. 2, the power amplifier circuit 10C includes an adjustment circuit 70C further including a diode D74 having an anode connected to a power supply terminal for supplying the variable power supply voltage Vcc1 via the resistor R71, and a cathode connected to the collector of the adjustment transistor Q70. With this configuration, the power amplifier circuit 10C can reduce gain expansion in the low-potential region. Gain expansion is a phenomenon in which gain increases with an increase in output level.

In the power amplifier circuit 10C, the anode of the diode D74 may be connected to the power supply terminal, and the cathode of the diode D74 may be connected to the collector of the adjustment transistor Q70 via the resistor R71. The diode D74 may be implemented as a diode-connected transistor.

The principle that the power amplifier circuit 10C including the diode D74 reduces gain expansion in the low-potential region will be described with reference to FIGS. 16 to 21.

Figure 16:
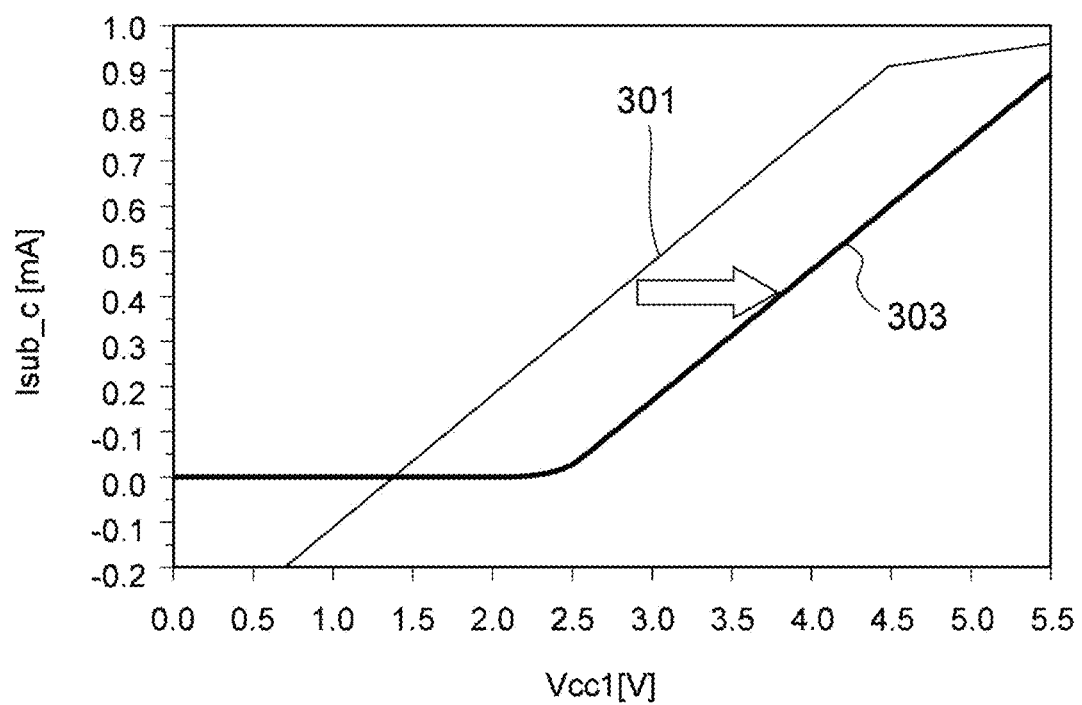
FIG. 16 is a graph illustrating the relationship between the variable power supply voltage $Vcc1$ and the current $Isub\_c$.

FIG. 16 is a graph illustrating the relationship between the variable power supply voltage Vcc1 and the current Isub_c. In FIG. 16, the horizontal axis represents the variable power supply voltage Vcc1, and the vertical axis represents the current Isub_c. In the graph illustrated in FIG. 16, line 301 indicates the relationship between the current Isub_c and the variable power supply voltage Vcc1 in the power amplifier circuit 10. Line 303 indicates the relationship between the current Isub_c and the variable power supply voltage Vcc1 in the power amplifier circuit 10C.

Figure 17:
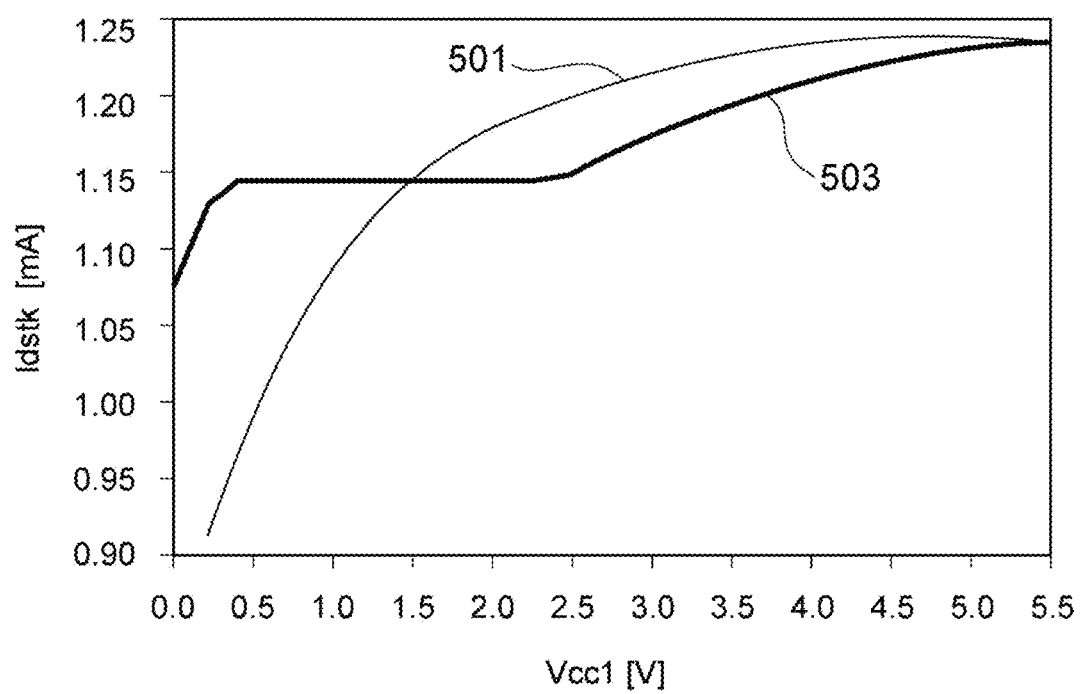
FIG. 17 is a graph illustrating the relationship between the variable power supply voltage $Vcc1$ and the current $Idstk$.

FIG. 17 is a graph illustrating the relationship between the variable power supply voltage Vcc1 and the current Idstk. In FIG. 17, the horizontal axis represents the variable power supply voltage Vcc1, and the vertical axis represents the current Idstk. In the graph illustrated in FIG. 17, line 501 indicates the relationship between the current Idstk and the variable power supply voltage Vcc1 in the power amplifier circuit 10. Line 503 indicates the relationship between the current Idstk and the variable power supply voltage Vcc1 in the power amplifier circuit 10C.

Figure 18:
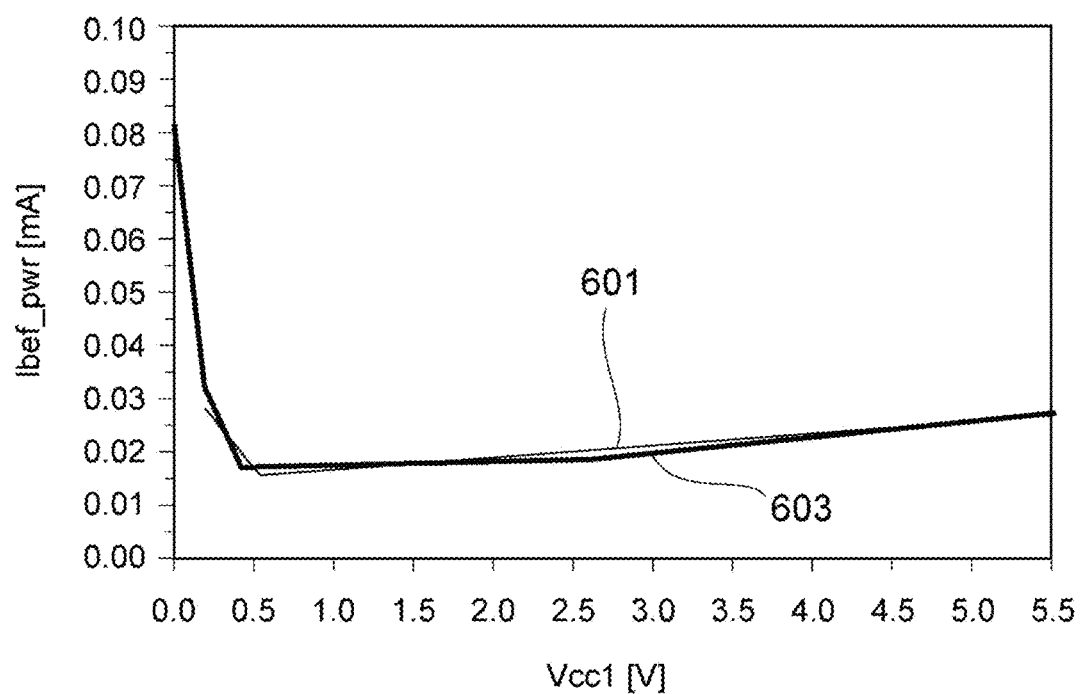
FIG. 18 is a graph illustrating the relationship between the variable power supply voltage $Vcc1$ and the current $Ibef\_pwr$.

FIG. 18 is a graph illustrating the relationship between the variable power supply voltage Vcc1 and the current Ibef_pwr. In FIG. 18, the horizontal axis represents the variable power supply voltage Vcc1, and the vertical axis represents the current Ibef_pwr. In the graph illustrated in FIG. 18, line 601 indicates the relationship between the current Ibef_pwr and the variable power supply voltage Vcc1 in the power amplifier circuit 10. Line 603 indicates the relationship between the current Ibef_pwr and the variable power supply voltage Vcc1 in the power amplifier circuit 10C.

Figure 19:
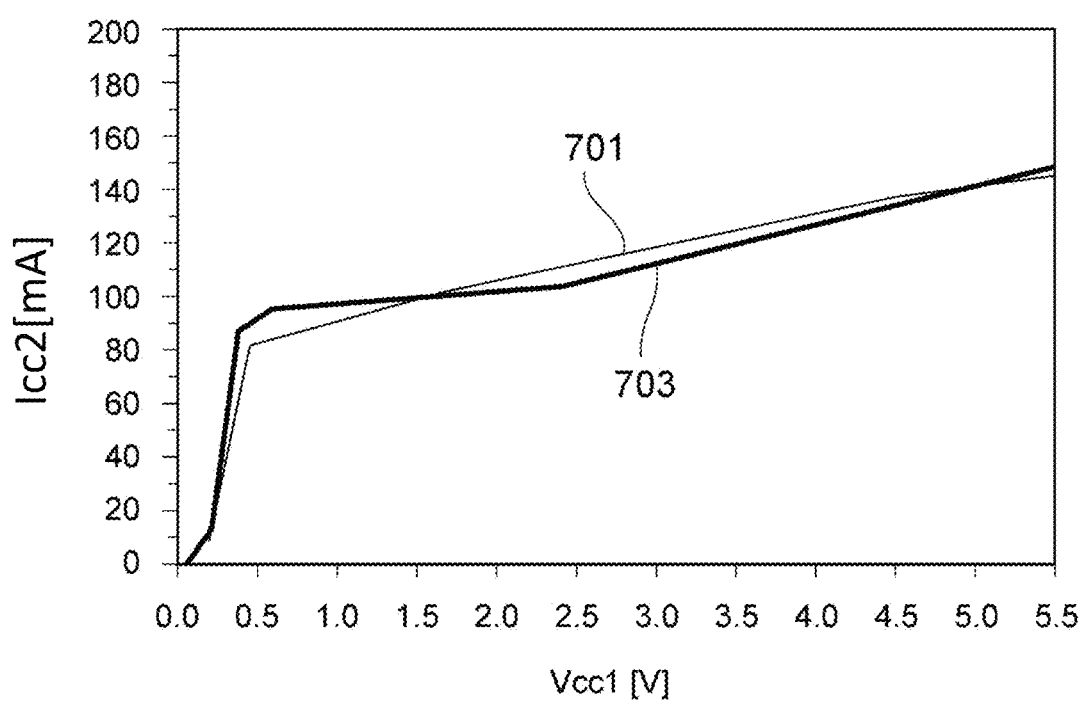
FIG. 19 is a graph illustrating the relationship between the variable power supply voltage $Vcc1$ and the current $Icc2$.

FIG. 19 is a graph illustrating the relationship between the variable power supply voltage Vcc1 and the current Icc2. In FIG. 19, the horizontal axis represents the variable power supply voltage Vcc1, and the vertical axis represents the current Icc2. In the graph illustrated in FIG. 19, line 701 indicates the relationship between the current Icc2 and the variable power supply voltage Vcc1 in the power amplifier circuit 10, and line 703 indicates the relationship between the current Icc2 and the variable power supply voltage Vcc1 in the power amplifier circuit 10C.

Figure 20:
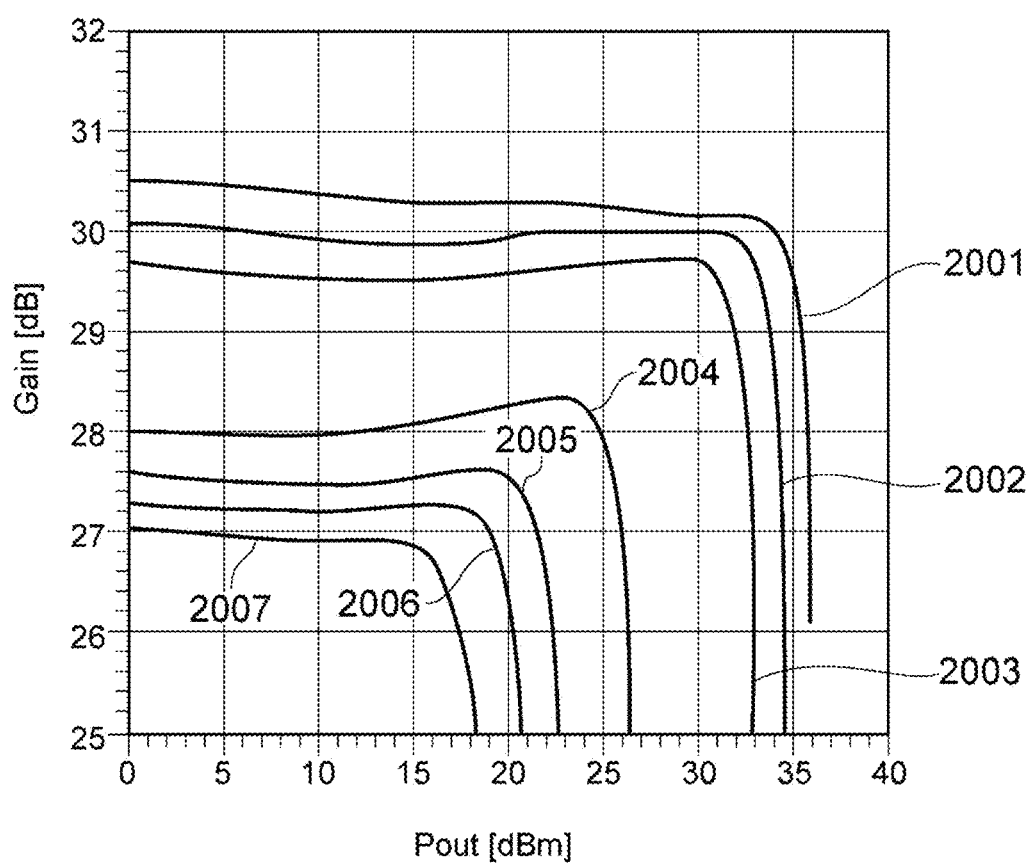
FIG. 20 is a graph illustrating the relationship between the output power and gain of the power amplifier circuit according to the modification illustrated in FIG. 15.

FIG. 20 is a graph illustrating the relationship between the output power and gain of the power amplifier circuit 10C. In the graph illustrated in FIG. 20, lines 2001, 2002, 2003, 2004, 2005, 2006, and 2007 indicate the relationship between the gain and output power of the power amplifier circuit 10C when the variable power supply voltage Vcc1 is set to 5.5 V, 4.5 V, 3.8 V, 2.0 V, 1.4 V, 1.2 V, and 1.0 V, respectively.

Figure 21:
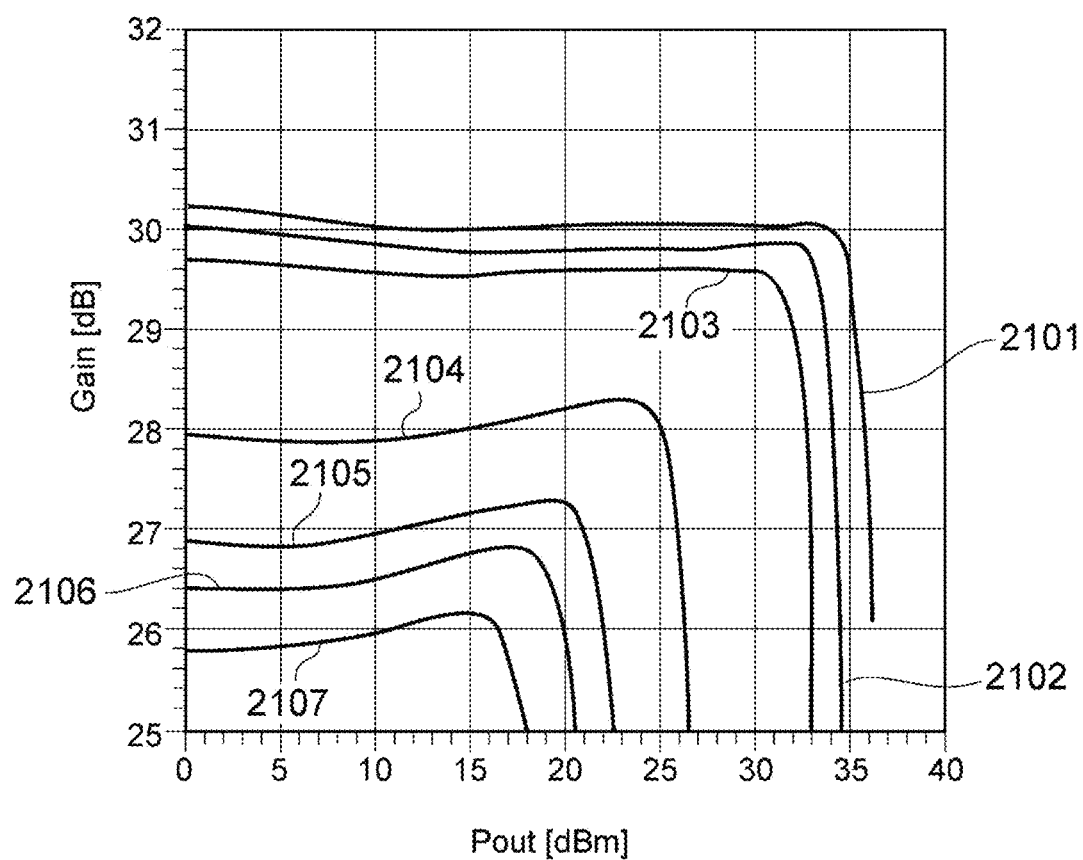
FIG. 21 is a graph illustrating the relationship between the output power and gain of the power amplifier circuit according to the embodiment.

FIG. 21 is a graph illustrating the relationship between the output power and gain of the power amplifier circuit 10. In FIGS. 20 and 21, the horizontal axis represents the output power Pout (dBm), and the vertical axis represents gain (dB). In the graph illustrated in FIG. 21, line 2101, 2102, 2103, 2104, 2105, 2106, and 2107 indicate the relationship between the gain and output power of the power amplifier circuit 10 when the variable power supply voltage Vcc1 is set to 5.5 V, 4.5 V, 3.8 V, 2.0 V, 1.4 V, 1.2 V, and 1.0 V, respectively.

In the power amplifier circuit 10, when the collector voltage Vc of the transistor Q70 is smaller than the base voltage Vb of the transistor Q70 in the low-potential region due to a decrease in the voltage Vce across the transistor Q70, a negative current Isub_c flows from the base to the collector of the transistor Q70. Accordingly, the current Ibef_pwr is rapidly decreased, and the bias current of the transistor Q2 is decreased. As a result, gain expansion occurs in the low-potential region.

In the power amplifier circuit 10, furthermore, if the voltage Vce across the transistor Q70 becomes small enough to fall within a non-linear region, the current Isub_c changes with respect to the variable power supply voltage Vcc1. When the current Isub_c starts to change with respect to the variable power supply voltage Vcc1, the current Icc2 starts to change with respect to the variable power supply voltage Vcc1. The change in the current Icc2 with respect to the variable power supply voltage Vcc1 in the low-potential region extends the gain dispersion.

The power amplifier circuit 10C includes the diode D74 to prevent the negative current Isub_c from flowing in the low-potential region to reduce the rate of the change in the current Icc2 with respect to the variable power supply voltage Vcc1.

The diode D74 decreases the collector voltage Vc of the transistor Q70 by a voltage Vdi (for example, about 1.3 V) applied to the diode D74, compared with the power amplifier circuit 10. That is, the transistor Q70 operates while being shifted to be higher than that in the power amplifier circuit 10 by the voltage Vdi.

Specifically, as illustrated in FIG. 16, the current Isub_c to be inputted to the collector of the transistor Q70 is shifted to the high-potential side by the voltage Vdi. Due to the diode D74, the current Isub_c does not show a negative value. The current Isub to be supplied from the emitter of the transistor Q70 is also shifted to the high-potential side by the voltage Vdi.

As illustrated in FIG. 17, the current Idstk to be supplied from the power supply terminal 61 to the anode of the diode D61 is shifted by the voltage Vdi, and shows a constant value in the low-potential region where the current Isub_c does not flow.

Then, as illustrated in FIG. 18, the current Ibef_pwr shows a substantially constant value in the low-potential region.

Accordingly, as illustrated in FIG. 19, the current Icc2 shows a substantially constant value in the low-potential region (for example, about 1.0 V to about 1.4 V).

Thus, the gain expansion is improved such that the gain in the low-potential region (for example, about 1.0 V to about 1.4 V) of the voltage Vcc1 illustrated in FIG. 20 shows a constant value compared with that in the low-potential region of the voltage Vcc1 illustrated in FIG. 21.

Figure 22:
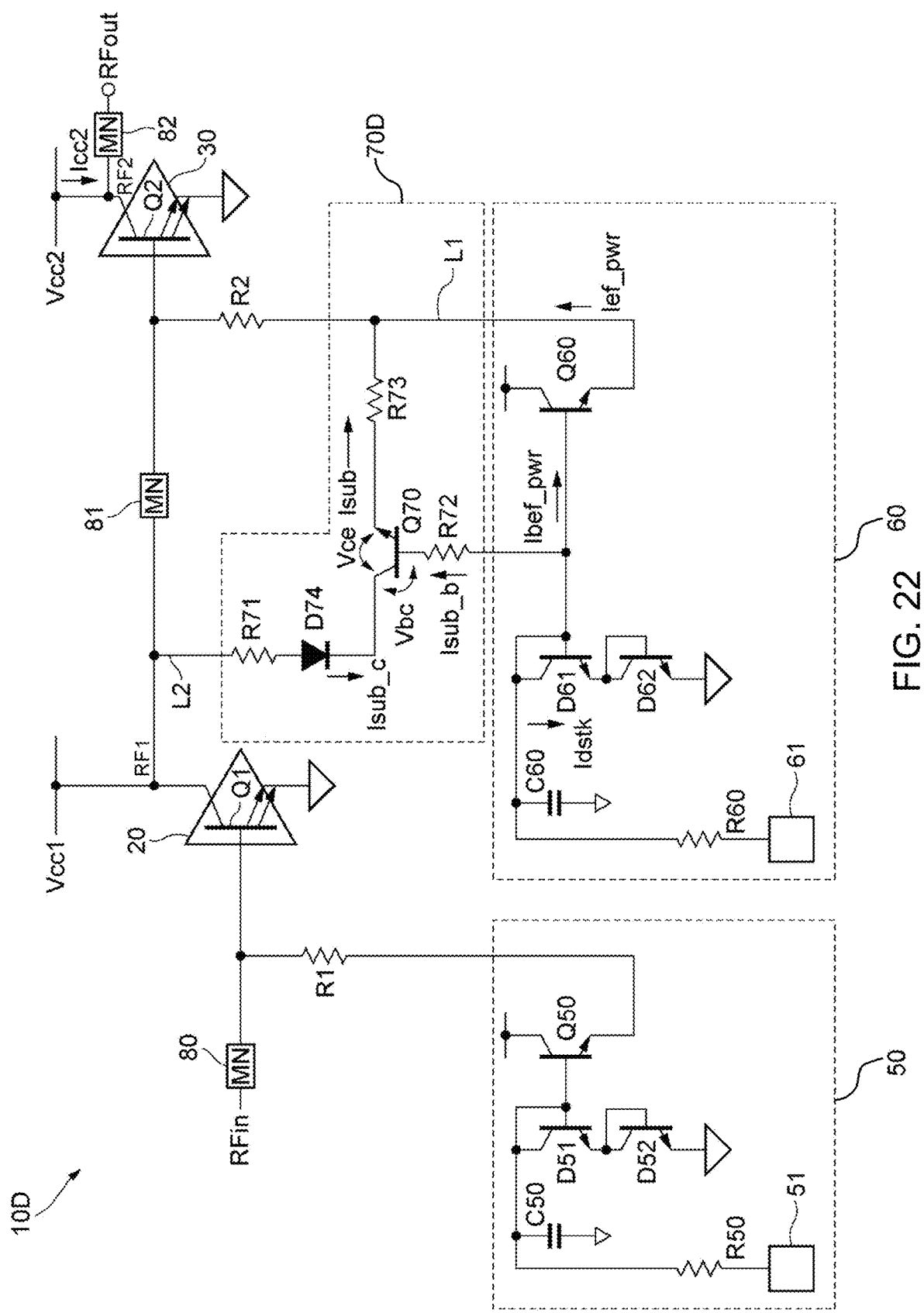
FIG. 22 illustrates an example configuration of a power amplifier circuit according to a modification.

FIG. 22 illustrates an example configuration of a power amplifier circuit 10D according to a modification. In this modification, the description of the matters common to the embodiment described above is omitted, and only the differences will be described. In particular, similar operations and effects achieved with similar configurations will not be described individually.

As illustrated in FIG. 22, the power amplifier circuit 10D includes an adjustment circuit 70D configured such that the emitter of the transistor Q70 is connected to the base of the transistor Q2. The adjustment circuit 70D of the power amplifier circuit 10D may include a diode D74 having an anode connected to the resistor R71 and a cathode connected to the collector of the adjustment transistor Q70. Like the power amplifier circuit 10C, the power amplifier circuit 10D can improve the gain expansion in the low-potential region of the variable power supply voltage Vcc1.

Accordingly, the power amplifier circuit 10 according to an exemplary embodiment of the present disclosure includes the transistor Q2 (first transistor) having a collector (first terminal) to which the voltage Vcc2 corresponding to the variable power supply voltage Vcc1 is to be supplied, and a base (second terminal) to which an RF signal is to be supplied, the transistor Q2 being configured to amplify the RF signal; the bias circuit 60 configured to supply a bias current or voltage to the base (second terminal) of the transistor Q2 (first transistor); and the adjustment circuit 70 configured to adjust the bias current or voltage in accordance with the variable power supply voltage Vcc1 supplied from a power supply terminal. The bias circuit 60 includes the diode D61 (first diode) having an anode to which a bias control voltage or current is to be supplied, and a cathode; the diode D62 (second diode) having an anode connected to the cathode of the diode D61 (first diode), and a cathode connected to ground; and the transistor Q60 (bias transistor) having a collector (first terminal) to which a power supply voltage is to be supplied, a base (second terminal) connected to the anode of the diode D61 (first diode), and an emitter (third terminal) connected to the base (second terminal) of the transistor Q2 (first transistor). The adjustment circuit 70 includes the resistor R71 (first resistor), and the transistor Q70 (adjustment transistor) having a collector (first terminal) connected to the power supply terminal for supplying the variable power supply voltage Vcc1 via the resistor R71 (first resistor), a base (second terminal) connected to the anode of the diode D61 (first diode), and an emitter (third terminal) connected to the anode of the diode D62 (second diode). With this configuration, the current change point Z1 of the current Icc2 can be shifted to the high-potential region (the current change point Z2) of the voltage Vcc1. Thus, the gain dispersion characteristic can be improved.

Further, the base (second terminal) of the transistor Q70 (adjustment transistor) of the power amplifier circuit 10 is connected to the anode of the diode D61 (first diode) via the resistor R72 (second resistor). With this configuration, the bias current or voltage to be supplied to the base of the transistor Q2 can be adjusted. Thus, the desired gain dispersion characteristic can be obtained.

Further, the emitter (third terminal) of the transistor Q70 (adjustment transistor) of the power amplifier circuit 10 is connected to the anode of the diode D62 (second diode) via the resistor R73 (third resistor). With this configuration, the bias current to be supplied to the base of the transistor Q2 can be adjusted. Thus, the desired gain dispersion characteristic can be obtained.

Further, the collector (first terminal) of the transistor Q70 (adjustment transistor) of the power amplifier circuit 10B is connected to the collector (first terminal) of the transistor Q2 (first transistor) via the resistor R71 (first resistor). With this configuration, even if the power supply voltage to be supplied to the transistor Q1 in the initial stage is a fixed voltage, the gain dispersion characteristic of the power amplifier circuit 10B can be improved.

The power amplifier circuit 10C further includes the diode D74 connected in series with the resistor R71 (first resistor). The collector (first terminal) of the adjustment transistor Q70 is connected to the power supply terminal for supplying the variable power supply voltage Vcc1 via the resistor R71 and the diode D74. With this configuration, the gain expansion in the low-potential region of the variable power supply voltage Vcc1 of the power amplifier circuit 10C can be improved.

The foregoing embodiment is intended to facilitate understanding of the present disclosure and should not be used to construe the present disclosure in a limiting fashion. The present disclosure may be modified or improved without departing from the spirit thereof, and the present disclosure also includes its equivalents. That is, the embodiment may be appropriately modified in design by those skilled in the art, and such modifications also fall within the scope of the present disclosure so long as the modifications include the features of the present disclosure. The elements included in the embodiment and the arrangement and so on thereof are not limited to those illustrated exemplarily, but can be modified as appropriate.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
   a first transistor having a first terminal to which a variable power supply voltage is supplied from a power supply terminal and a second terminal to which a radio-frequency signal is supplied, the first transistor being configured to amplify the radio-frequency signal;
   a bias circuit configured to supply a bias current or bias voltage to the second terminal of the first transistor; and
   an adjustment circuit configured to adjust the bias current or bias voltage in accordance with the variable power supply voltage supplied from the power supply terminal,
   the bias circuit including
      a first diode having an anode to which a bias control voltage or current is supplied, and a cathode,
      a second diode having an anode connected to the cathode of the first diode and a cathode connected to ground, and
      a bias transistor having a first terminal to which a power supply voltage is supplied, a second terminal connected to the anode of the first diode, and a third terminal connected to the second terminal of the first transistor,
   the adjustment circuit including
      a first resistor, and
      an adjustment transistor having a first terminal connected to the power supply terminal via the first resistor, a second terminal connected to the anode of the first diode, and a third terminal connected to the anode of the second diode.

2. The power amplifier circuit according to claim 1, wherein the second terminal of the adjustment transistor is connected to the anode of the first diode via a second resistor.

3. The power amplifier circuit according to claim 1, wherein the third terminal of the adjustment transistor is connected to the anode of the second diode via a third resistor.

4. The power amplifier circuit according to claim 2, wherein the third terminal of the adjustment transistor is connected to the anode of the second diode via a third resistor.

5. The power amplifier circuit according to claim 1, wherein the first terminal of the adjustment transistor is connected to the first terminal of the first transistor via the first resistor.

6. The power amplifier circuit according to claim 2, wherein the first terminal of the adjustment transistor is connected to the first terminal of the first transistor via the first resistor.

7. The power amplifier circuit according to claim 3, wherein the first terminal of the adjustment transistor is connected to the first terminal of the first transistor via the first resistor.

8. The power amplifier circuit according to claim 1, further comprising
   a third diode connected in series with the first resistor,
   wherein the first terminal of the adjustment transistor is connected to the power supply terminal via the first resistor and the third diode.

9. The power amplifier circuit according to claim 2, further comprising
   a third diode connected in series with the first resistor,
   wherein the first terminal of the adjustment transistor is connected to the power supply terminal via the first resistor and the third diode.

10. The power amplifier circuit according to claim 3, further comprising
    a third diode connected in series with the first resistor,
    wherein the first terminal of the adjustment transistor is connected to the power supply terminal via the first resistor and the third diode.

11. The power amplifier circuit according to claim 4, further comprising
    a third diode connected in series with the first resistor,
    wherein the first terminal of the adjustment transistor is connected to the power supply terminal via the first resistor and the third diode.

12. The power amplifier circuit according to claim 1, wherein the variable power supply voltage is supplied to the first terminal of the adjustment transistor via the first resistor.

13. The power amplifier circuit according to claim 2, wherein the variable power supply voltage is supplied to the first terminal of the adjustment transistor via the first resistor.

14. The power amplifier circuit according to claim 1, wherein the bias circuit further includes a fourth resistor, and wherein bias control voltage or current is supplied to the anode of the first diode via the fourth resistor.

15. The power amplifier circuit according to claim 2, wherein the bias circuit further includes a fourth resistor, and wherein bias control voltage or current is supplied to the anode of the first diode via the fourth resistor.

16. The power amplifier circuit according to claim 1, wherein the anode of the first diode is connected to ground via a capacitor.

17. The power amplifier circuit according to claim 2, wherein the anode of the first diode is connected to ground via a capacitor.

18. The power amplifier circuit according to claim 1, wherein the first diode and the second diode are connected in series.

19. The power amplifier circuit according to claim 2, wherein the first diode and the second diode are connected in series.

20. The power amplifier circuit according to claim 3, wherein the first diode and the second diode are connected in series.

\* \* \* \* \*